United States Patent
Horio et al.

(10) Patent No.: US 6,356,136 B1
(45) Date of Patent: Mar. 12, 2002

(54) NONLINEAR RESISTOR CIRCUIT USING CAPACITIVELY-COUPLED MULTI-INPUT MOSFETS

(75) Inventors: Yoshihiko Horio, Warabi; Kenichi Watarai, Matsudo; Kazuyuki Aihara, Narashino, all of (JP)

(73) Assignee: Japan Science and Technology Corporation (JP)

( * ) Notice: Subject to any disclaimer, the term of this patent is extended or adjusted under 35 U.S.C. 154(b) by 0 days.

(21) Appl. No.: 09/529,657
(22) PCT Filed: Aug. 12, 1999
(86) PCT No.: PCT/JP99/04357
§ 371 Date: Apr. 18, 2000
§ 102(e) Date: Apr. 18, 2000

(30) Foreign Application Priority Data

Aug. 26, 1998 (JP) .......................................... 10-239316

(51) Int. Cl.[7] ............................................... H03K 17/16
(52) U.S. Cl. ......................................... 327/390; 327/344
(58) Field of Search ................................ 327/108, 334, 327/344, 390, 391, 589, 111, 337

(56) References Cited

U.S. PATENT DOCUMENTS 4,306,300 A * 12/1981 Terman et al. ............. 166/270.1
5,937,399 A *  8/1999 Ohmi et al. ................... 706/33

OTHER PUBLICATIONS

IEICE Transactions, vol. E82–A, No. 9, Sep. 1999, pp 1926–1936.
IEEE Transactions on Electron Devices, Jul. 1974, pp 448–449.
IEEE Transactions on Circuit Theory, 1963, pp. 25–35.
IEEE Journal of Solid–State Circuits, vol. 31, No. 8, Aug. 1996, pp. 1123–1131.

* cited by examiner

Primary Examiner—Terry D. Cunningham
Assistant Examiner—Paul Dinh
(74) Attorney, Agent, or Firm—Lorusso & Loud

(57) ABSTRACT

A nonlinear resistor circuit utilizes capacitively-coupled multi-input MOSFETs in order to enable integration thereof by a standard CMOS process, and which can realize two types of nonlinear resistance characteristics; i.e., A-type and V-type nonlinear resistance characteristics. The circuit includes a core circuit which comprises enhancement-type N-channel and P-channel MOSFETs with source terminals being connected with each other.

2 Claims, 18 Drawing Sheets

F I G. 6 (e)
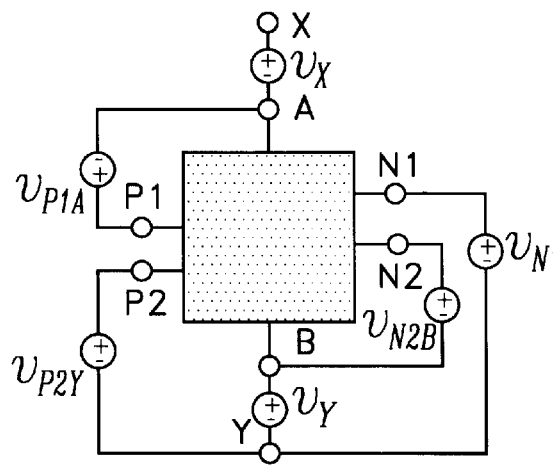
F I G. 6 (f)
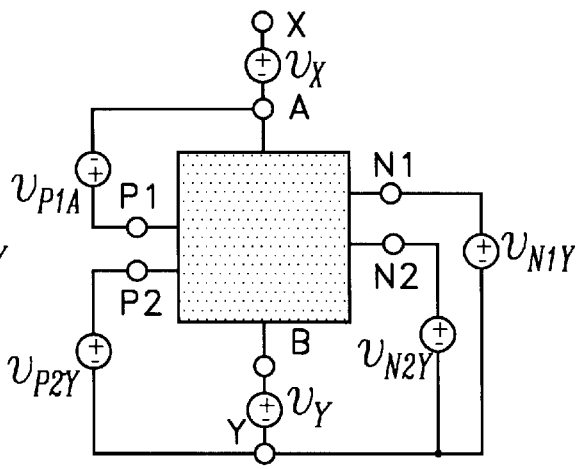
F I G. 6 (g)
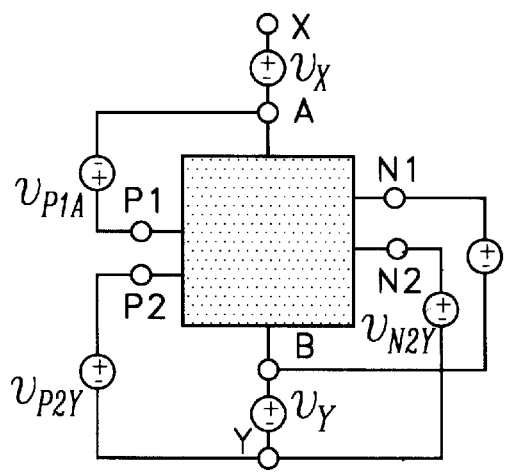
F I G. 6 (h)
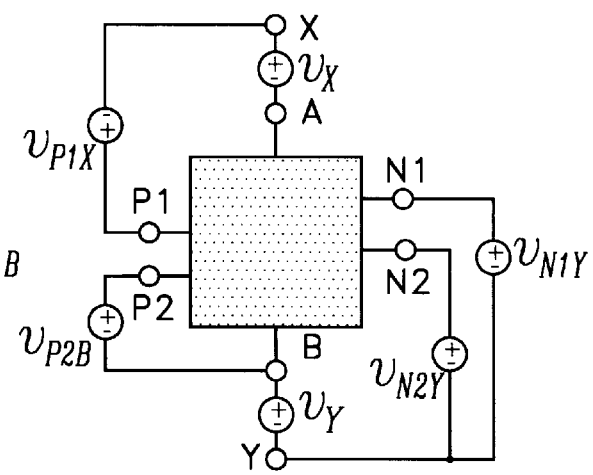

F I G. 6 (m)
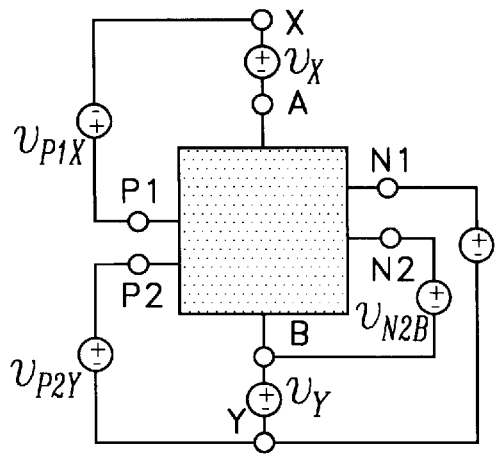
F I G. 6 (n)
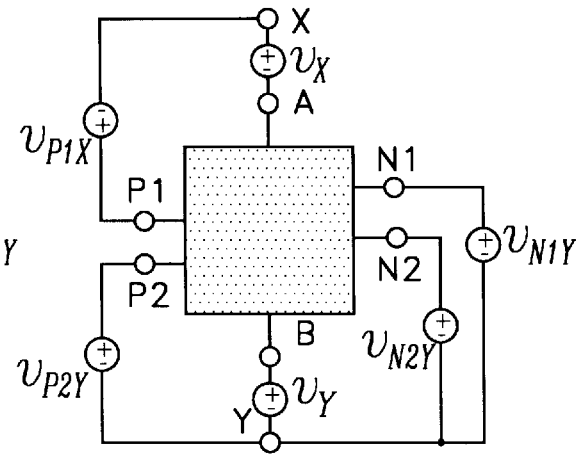
F I G. 6 (o)
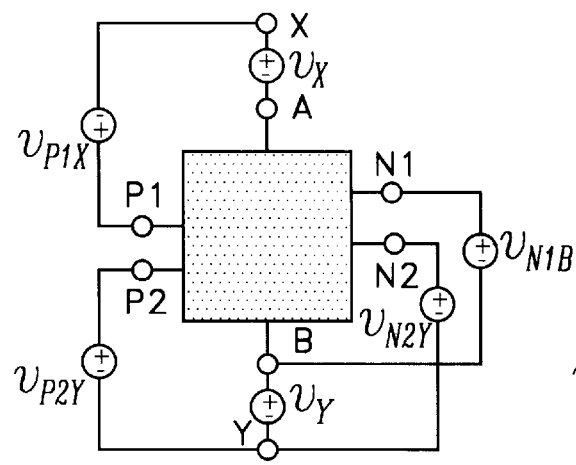
F I G. 6 (p)
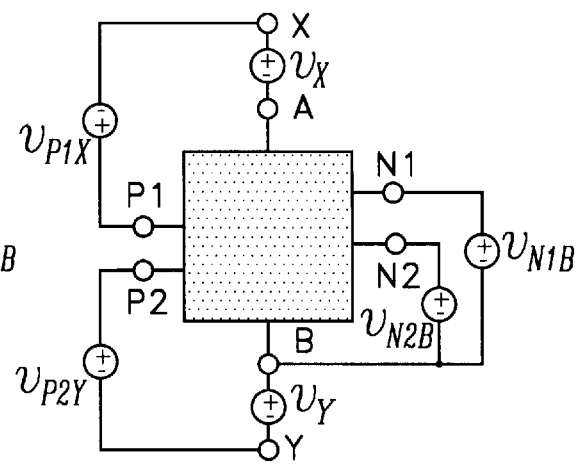

F I G. 8 (e)
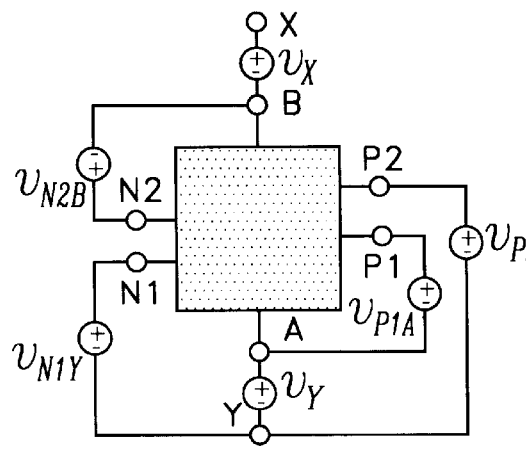
F I G. 8 (f)
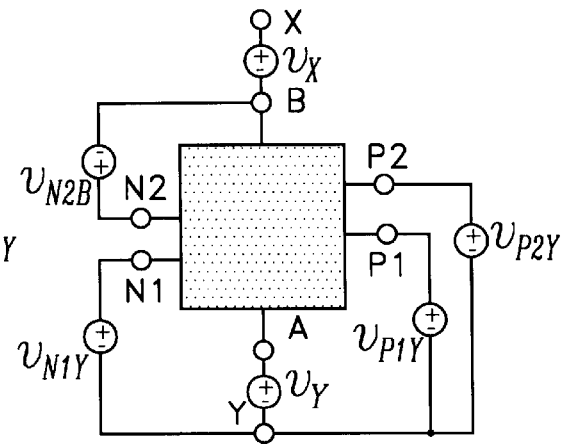
F I G. 8 (g)
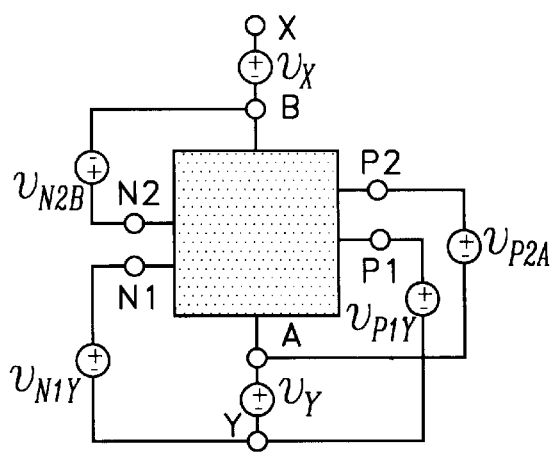
F I G. 8 (h)
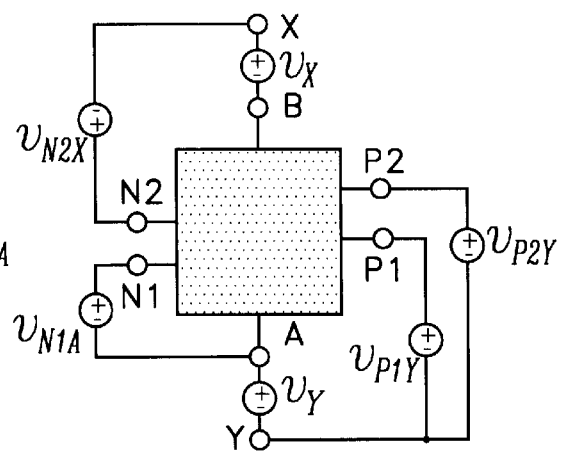

F I G. 18
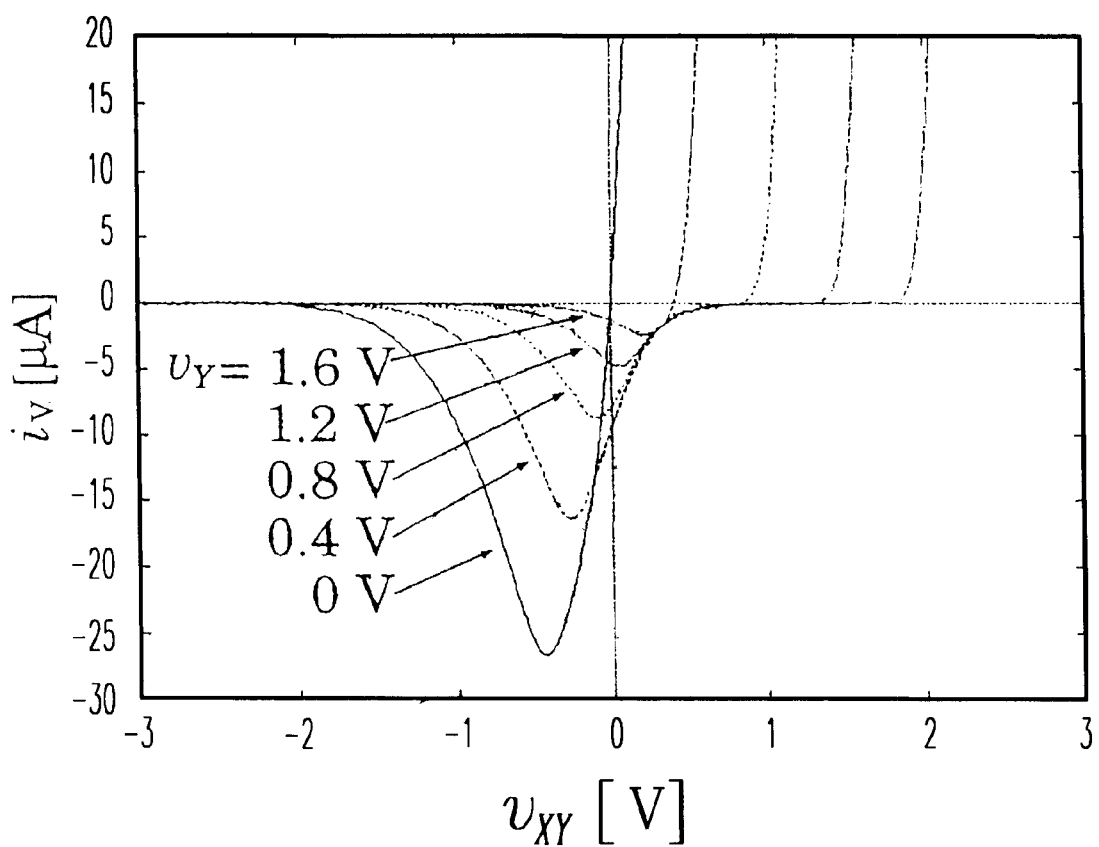

US 6,356,136 B1

NONLINEAR RESISTOR CIRCUIT USING CAPACITIVELY-COUPLED MULTI-INPUT MOSFETS

TECHNICAL FIELD

The present invention relates to a nonlinear resistor circuit using capacitively-coupled multi-input MOSFETS, and more particularly to a nonlinear negative resistor circuit using capacitively-coupled multi-input MOSFETs.

BACKGROUND ART

Devices and circuits having a nonlinear current-voltage (I-V) characteristic, especially those having a negative resistance characteristic, play important roles in logic circuits, memory circuits, oscillators, impedance conversion circuits, various nonlinear signal processing circuits, and chaos generators.

There have been proposed various types of such devices, including a device circuit having a Λ-type I-V characteristic and realized through combined use of bipolar junction transistors (BJTs) and/or field effect transistors (FETs) (First reference: L. O. Hill, D. O. Pederson, and R. S. Pepper, "Synthesis of Electronic Bistable Circuits," IEEE Transactions on Circuit Theory, vol. CT-10, pp. 25–35, 1963).

Further, a method of effectively realizing the circuit through employment of a technique for integrating two junction FETs (J-FETs) has been proposed (Second reference: G. Kano and H. Iwasa, "A new Λ-type Negative Resistance Device of Integrated Complementary FET Structure," IEEE Transactions. Electron Devices, vol. 21, no. 7, pp. 448–449, 1974).

Moreover, a Λ-type transistor circuit that realizes a Λ-type negative resistance characteristic by use of two MOSFETs has been proposed and applied to an impedance conversion circuit and a neuron circuit (Third reference: Kennosuke Sugisaki, Hisahiro Sekine, Yoshifumi Sekine, Kohei Nakamura, and Masatoshi Suyama, "A Λ-type transistor using two MOS-FETs," Proc. Denki-Kankei-Gakkai, Tohoku-shibu Rengo-Taikai, 2G9, p. 270, 1978; Fourth reference: Hisahiro Sekine, Kennosuke Sugisaki, Hitoshi Sato, Yoshifumi Sekine, and Masatoshi Suyama, "The equivalent inductance using a Λ-type transistor," IEICE Trans., vol. J63-C, no. 5, pp. 325–327, 1980; and Fifth reference: Hoshifumi Sekine, Masahiko Nakamura, Toshiyuki Ochiai, and Masatoshi Suyama, "Utilization of a Λ-type transistor for a hardware neuron model," IEICE Trans., vol. J68-A, no. 7, pp. 672–679, 1985).

DISCLOSURE OF THE INVENTION

The above-described conventional circuit cannot be integrated by a standard CMOS process in which only enhancement-type MOSFETs are available, because at least one of the MOSFETs in the circuit must be of a depletion type, An object of the present invention is to provide a nonlinear resistor circuit which utilizes capacitively-coupled multi-input MOSFETs in order to enable integration thereof by a standard CMOS process, and which can realize two types of nonlinear resistance characteristics; i.e., Λ-type and V-type nonlinear resistance characteristics. Thus, the present invention solves the above-described problems.

The capacitively-coupled multi-input MOSFET comprises a MOSFET and a plurality of capacitors which are connected to the gate terminal in parallel and provide a number of input terminals. The operation of the capacitively-coupled multi-input MOSFET can be controlled through control of voltage applied to one or more of the capacitively-coupled input terminals. The structure of the circuit is the same as a multi-input floating gate MOSFET, which effects a linear weighted summation of input, such as a VMOSFET (see Sixth reference; T. Shibata and T. Ohmi, "A Functional MOS Transistor Featuring Gate-level Weighted Sum and Threshold Operations," IEEE Transactions. Electron Devices, vol. 39, no. 6, pp. 1444–1455, 1992) and an MFMOSFET (see Seventh reference: H. R. Mehrvarz and C. Y. Kwok, "A Novel Multi-Input Floating-Gate MOS Four-Quadrant Analog Multiplier," IEEE J. of Solid State Circuits, vol. 31, no. 8, pp. 1123–1131, 1996).

Since such linear summation does not play an important role in the nonlinear resistor circuit of the present invention, the input coupling capacitors are not required to have linear characteristics. Therefore, as used herein, the term "capacitively-coupled multi-input MOSFET" refers to a more general circuit configuration, including a VMOSFET. Therefore, the nonlinear resistor circuit according to the present invention can be integrated by a less-expensive CMOS process in which linear capacitors are not available.

Further, the size of the nonlinear resistor circuit according to the present invention can be reduced if a floating gate device such as a VMOSFET can be used.

In order to achieve the above object, the present invention provides:

[1] A nonlinear resistor circuit using capacitively-coupled multi-input MOSFETs, comprising a core circuit which has a nonlinear resistance characteristic and which comprises an enhancement-type first-channel MOSFET having a capacitively-coupled multi-input gate terminal, and an enhancement-type second-channel MOSFET having a capacitively-coupled multi-input gate terminal, the source terminals of the MOSFETs being connected with each other.

[2] A nonlinear resistor circuit using capacitively-coupled multi-input MOSFETs as described in [1] above, wherein the first channel of the core circuit is an N channel, and the second channel of the core circuit is a P channel, so that a Λ-type current-voltage characteristic is obtained.

[3] A nonlinear resistor circuit using capacitively-coupled multi-input MOSFETs as described in [2] above, wherein the Λ-type current-voltage characteristic is varied through application of an external control voltage.

[4] A nonlinear resistor circuit using capacitively-coupled multi-input MOSFETs as described in [3] above, wherein, as shown in FIGS. 6($a$)–6($p$), a fifth potential ($v_X$) is provided between the drain terminal (A) of the N-channel MOSFET and a first input/output terminal (X); a sixth potential ($V_Y$) is provided between the drain terminal (B) of the P-channel MOSFET and a second input/output terminal (Y); a first potential ($v_{P1A}$, $v_{P1X}$) is provided between the drain terminal (A) of the N-channel MOSFET and a first capacitor ($C_{P1}$) connected to the gate of the P-channel MOSFET or between the first input/output terminal (X) and the first capacitor ($C_{P1}$); a second potential ($V_{P2B}$, $V_{P2Y}$) is provided between the drain terminal (B) of the P-channel MOSFET and a second capacitor ($C_{P2}$) connected to the gate of the P-channel MOSFET or between the second input/output terminal (Y) and the second capacitor ($C_{P2}$); a third potential ($v_{N1B}$, $v_{N1Y}$) is provided between the drain terminal (B) of the P-channel MOSFET and a third capacitor ($C_{N1}$) connected to the gate of the N-channel MOSFET or between the second input/output terminal (Y) and the third capacitor ($C_{N1}$); and a fourth potential ($v_{N2B}$, $v_{N2Y}$) is provided between the drain terminal (B) of the P-channel MOSFET and a fourth capacitor ($C_{N2}$) connected to the gate of the N-channel MOSFET or between the second input/output terminal (Y) and the fourth capacitor ($C_{N2}$).

[5] A nonlinear resistor circuit using capacitively-coupled multi-input MOSFETs as described in [1] above, wherein the first channel of the core circuit is a P channel, and the second channel of the core circuit is an N channel, so that a V-type current-voltage characteristic is obtained.

[6] A nonlinear resistor circuit using capacitively-coupled multi-input MOSFETs as described in [5] above, wherein the V-type current-voltage characteristic is varied through application of an external control voltage,

[7] A nonlinear resistor circuit using capacitively-coupled multi-input MOSFETs as described in [6] above, wherein, as shown in FIGS. 8(a)–8(p), an eleventh potential ($v_X$) is provided between the drain terminal (B) of the P-channel MOSFET and a first input/output terminal (X); a twelfth potential ($v_Y$) is provided between the drain terminal (A) of the N-channel MOSFET and a second input/output terminal (Y); a seventh potential ($v_{N2A}$, $v_{N2X}$) is provided between the drain terminal (B) of the P-channel MOSFET and a fifth capacitor ($C_{N2}$) connected to the gate of the N-channel MOSFET or between the first input/output terminal (X) and the fifth capacitor ($CN_2$); an eighth potential ($v_{N1A}$, $v_{N1Y}$) is provided between the drain terminal (A) of the N-channel MOSFET and a sixth capacitor ($C_{N1}$) connected to the gate of the N-channel MOSFET or between the second input/output terminal (Y) and the sixth capacitor ($C_{N1}$); a ninth potential ($v_{P2A}$, $v_{P2Y}$) is provided between the drain terminal (A) of the N-channel MOSFET and a seventh capacitor ($C_{P2}$) connected to the gate of the P-channel MOSFET or between the second input/output terminal (Y) and the seventh capacitor ($C_{P2}$); and a tenth potential ($v_{P1A}$, $v_{P1Y}$) is provided between the drain terminal (A) of the N-channel MOSFET and an eighth capacitor ($C_{P1}$) connected to the gate of the P-channel MOSFET or between the second input/output terminal (Y) and the eight capacitor ($C_{P1}$).

BRIEF DESCRIPTION OF THE DRAWINGS

FIG. 18 is a graph showing $v_{XY}$-$i_\Lambda$ characteristics of the circuit of FIG. 9, where $v_{P2Y}$=–4 V, $v_{N1Y}$=3.2 V, $v_{N2B}$=$v_X$=0 V, $v_{N2Y}$=$v_Y$, and $v_Y$ is a parameter.

BEST MODE FOR CARRYING OUT THE INVENTION

Embodiments of the present invention will next be described in detail.

[1] Capacitively-Coupled Multi-Input MOSFETs

Figure 1:
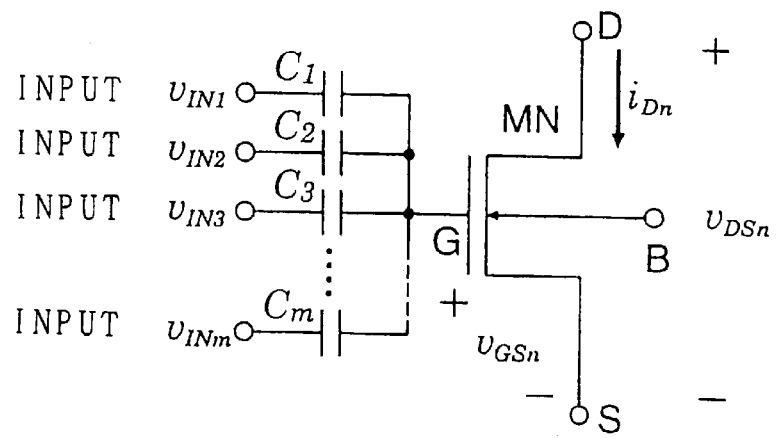
FIG. 1 is a circuit diagram of an N-channel MOSFET having multiple capacitively-coupled inputs according to the present invention.

FIG. 1 is a circuit diagram of a capacitively-coupled multi-input N-channel MOSFET according to the present invention. As shown in FIG. 1, the capacitively-coupled multi-input N-channel MOSFET (referred to as NMOSFET hereinafter) includes an ordinary NMOSFET, and a plurality of capacitors $C_1$ to $C_m$ which are connected to a gate terminal G of the NMOSFET and serve as input terminals. Input voltages are applied via the capacitors $C_1$ to $C_m$, and thus the gate terminal G of the NMOSFET MN becomes a floating gate.

Let the voltages of the source terminal S, the drain terminal D, the gate terminal G, and the body terminal B, with respect to ground, be $v_{Sn}$, $v_{Pn}$, $v_{Gn}$, and $v_{Bn}$, respectively. As shown in FIG. 1, $v_{IN1}$, $v_{IN2}$, $v_{IN3}$, . . . , $v_{1Nm}$ represents voltages applied to the respective input terminals, with respect to ground. $C_0$ represents the sum of the gate-oxide capacitance and all the parasitic capacitances such as gate-to-body capacitance, gate-to-drain capacitance, and gate-to-source capacitance. $C_1$, $C_2$, $C_3$, . . . $C_m$ represent coupling capacitances between the gate terminal and the respective input terminals.

It is assumed that there is no leakage of electrical charge and that the initial electrical charge of the gate terminal G is 0. In addition, it is assumed that the source terminal S and the body terminal B are connected to each other. Furthermore, the parasitic capacitance $C_0$ is considered to have no qualitative influence on the characteristics of the circuits described below. Therefore, for simplicity of analysis, it is assumed that:

$$C_0 \ll C_i \text{ for } i=1 \text{ to } m \tag{1}$$

The approximate potential of the gate terminal G is given by:

$$v_{G_n} \approx \frac{\sum_{i=1}^{m}(C_i \cdot v_{INi})}{C_T} \tag{2}$$

where $$C_T = \sum_{i=1}^{m} C_i \tag{3}$$

In the following, the threshold voltage of MN with respect to the source terminal S is denoted as $v_{tn}$, the voltage between gate and source as $v_{GSn}=v_{Gn}-v_{Sn}$, and voltage between drain and source as $v_{DSn}=v_{Dn}-v_{Sn}$. In this case, a state of MN and a drain current $i_{Dn}$ are obtained as follows, depending on the relationship among the potentials of the respective terminals.

1. When $v_{GSn} < V_{tn}$, that is, $$\frac{\sum_{i=1}^{m}(C_i \cdot v_{INi})}{C_T} - v_{Sn} < V_{tn} :$$

In this case, MN is in the cutoff region of operation. Therefore, $$i_{Dn}=0. \tag{4}$$

2. When $v_{GSn} \geq V_{tn}$, that is, $$\frac{\sum_{i=1}^{m}(C_i \cdot v_{INi})}{C_T} - v_{Sn} \geq V_{tn} :$$

In this case, MN is under inversion, so that $i_{DN} \neq 0$. Further, under this condition, MN is in either the triode region or the saturation region, depending on the voltage of the drain terminal.

In the following, the channel modulation effect is ignored for simplicity and the voltage between the drain and the source is denoted as $v_{DSn}$.

(a) When $v_{DSn} < v_{GSn} - V_{tn}$, i.e., $$v_{DSn} < \frac{\sum_{i=1}^{m}(C_i \cdot v_{INi})}{C_T} - v_{Sn} - V_{tn} :$$

In this case, MN is in the triode region. Therefore, the drain current is obtained from the following equation.

$$i_{Dn} = K_n\{2(v_{GSn}-V_{tn})v_{DSn} - v_{DSn}^2\} \tag{5}$$

$$= K_n\left\{2\left(\frac{\sum_{i=1}^{m}(C_i \cdot v_{INi})}{C_T} - v_{Sn} - V_{tn}\right)v_{DSn} - v_{DSn}^2\right\} \tag{6}$$

where $K_n=(1/2)\mu_n C_{ox}(W_n/L_n)$, $\mu_n$ is electron mobility, $C_{ox}$ is the oxide capacitance of MN, and $W_n$ and $L_n$ are the gate width and channel length of MN (these are the same in the following description).

(b) When $v_{DSn} \geq v_{GSn}-V_{tn}$, i.e., $$v_{DSn} \geq \frac{\sum_{i=1}^{m}(C_i \cdot v_{INi})}{C_T} - v_{Sn} - V_{tn} :$$

In this case, MN is in the saturation region. Therefore, the drain current is obtained from the following equations.

$$i_{Dn} = K_n(v_{GSn}-V_{tn})^2 \tag{7}$$

$$= K_n\left(\frac{\sum_{i=1}^{m}(C_i \cdot v_{INi})}{C_T} - v_{Sn} - V_{tn}\right)^2 \tag{8}$$

From the above analyses, a capacitively-coupled multi-input MOSFET is considered a device whose drain current can be determined from the relative relationships between input voltages $v_{IN1}$.

[1-2] Capacitively-Coupled Multi-Input P-Channel MOSFET

Figure 2:
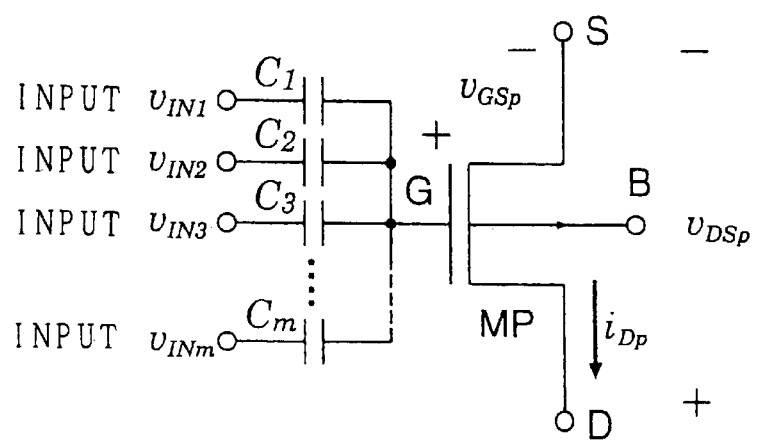
FIG. 2 is a circuit diagram of a P-channel MOSFET; having m capacitively-coupled inputs according to the present invention.

FIG. 2 is a circuit diagram of a PMOSFET having m capacitively-coupled input terminals according to the present invention. A source terminal and a body terminal are connected to each other, as in the case of a NMOSFET. In addition, Eq. (1) is given herein for simplicity.

In this case, voltage $v_{GP}$ of the gate terminal G of MP with respect to ground is given by the following equation similar to Eq. (2).

$$v_{G_p} \approx \frac{\sum_{i=1}^{m}(C_i \cdot v_{INi})}{C_T} \tag{9}$$

Let the voltages of the source terminal S and the drain terminal D with respect to ground be $v_{SP}$ and $v_{Dp}$, respectively. In addition, let the threshold voltage of MP with respect to the source terminal S be $v_{tp}$, the voltage between gate and source be $v_{GSp}=v_{Gp}-v_{Sp}$, and voltage between drain and source be $v_{DBp}=v_{Dp}-v_{Sp}$. Moreover, the channel modulation effect is ignored for simplicity. In this case, the drain current is $i_{Dp}$ is given by the following analyses.

1. When $v_{GSp} > v_{tp}$, that is, $$\frac{\sum_{i=1}^{m}(C_i \cdot v_{INi})}{C_T} - v_{Sp} > V_{tp} :$$

In this case, MP is in the cutoff region of operation. Therefore, $$i_{Dp}=0. \tag{10}$$

2. When $v_{GSp} \leq V_{tp}$, that is, $$\frac{\sum_{i=1}^{m}(C_i \cdot v_{INi})}{C_T} - v_{Sp} \leq V_{tp}:$$

In this case, MP is under inversion, so that $i_{Dp} \neq 0$. Further, under this condition, MP is in either the triods region or the saturation region, depending on the voltage of the drain terminal.
(a) When $v_{DSp} > v_{GSp} - V_{tp}$, i.e., $$v_{DSp} > \frac{\sum_{i=1}^{m}(C_i \cdot v_{INi})}{C_T} - v_{Sp} - V_{tp}:$$

In this case, MP is in the triode region. Therefore, the drain current is obtained from the following equation.

$$i_{Dp} = K_p\{2(v_{GSp} - V_{tp})v_{DSp} - v_{DSp}^2\} \quad (11)$$

$$= K_p\left\{2\left(\frac{\sum_{i=1}^{m}(C_i \cdot v_{INi})}{C_T} - v_{Sp} - V_{tp}\right)v_{DSp} - v_{DSp}^2\right\} \quad (12)$$

where $K_p = (1/2)\mu_p C_{ox}(W_p/L_p)$, $\mu_p$ is hole mobility, $C_{ox}$ is the oxide capacitance of MP, and $W_p$ and $L_p$ are the gate width and channel length of MP (these are the same in the following description).
(b) When $v_{DSp} \leq v_{GSp} - V_{tp}$, i.e., $$v_{DSp} \leq \frac{\sum_{i=1}^{m}(C_i \cdot v_{INi})}{C_T} - v_{Sp} - V_{tp}:$$

In this case, MP is in the saturation region, Therefore, the drain current is obtained from the following equations.

$$i_{Dp} = K_p(v_{GSp} - V_{tp})^2 \quad (13)$$

$$= K_p\left(\frac{\sum_{i=1}^{m}(C_i \cdot v_{INi})}{C_T} - v_{Sp} - V_{tp}\right)^2 \quad (14)$$

[2] Nonlinear Resistor Circuits Using Capacitively-Coupled Multi-Input MOSFET

Figure 3:
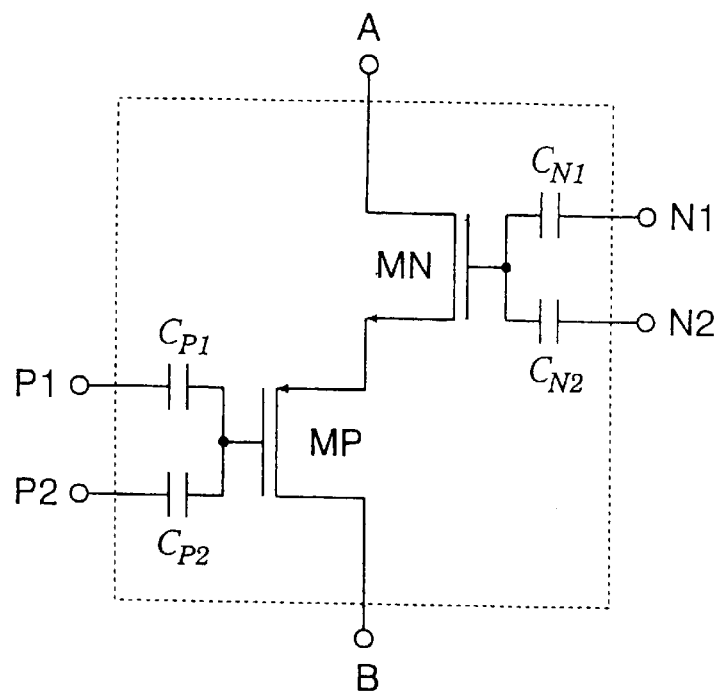
FIG. 3 is a diagram in relation to an embodiment of the present invention, showing a circuit which serves as a core of a nonlinear resistor circuit.

Next will be described a circuit which comprises two capacitively-coupled multi-input MOSFETs in order to achieve various nonlinear resistance characteristics. The basic structure of the circuit was determined with reference to the first reference through the third reference mentioned in the Background Art section.
[2-1] The Core Circuit FIG. 3 is a circuit serving as a core of a nonlinear resistor circuit showing an embodiment of the present invention.

The circuit comprises an NMOSFET (MN) having capacitively-coupled inputs and a PMOSFET (MP) having capacitively-coupled inputs, wherein the source terminals of MN and MP are connected with each other. In FIG. 3, each FET has only 2 input terminals, but generally, it is assumed to have n input terminals. In addition, body terminals are omitted in FIG. 3 for simplicity. As shown in FIG. 3, the drain terminal of MN is labeled A and the drain terminal of MP is labeled B. Moreover, two capacitors of MN are denoted as $C_{N1}$ and $C_{N2}$, two capacitors of MP as $C_{P1}$ and $C_{P2}$, and input terminals of these capacitors are labeled N1, N2, P1, and P2 respectively. In the following sections, the circuit will be referred to as a "core circuit."

[2-2] Basic Circuit Configuration for Realizing Λ-shaped I-V Characteristics

Figure 4:
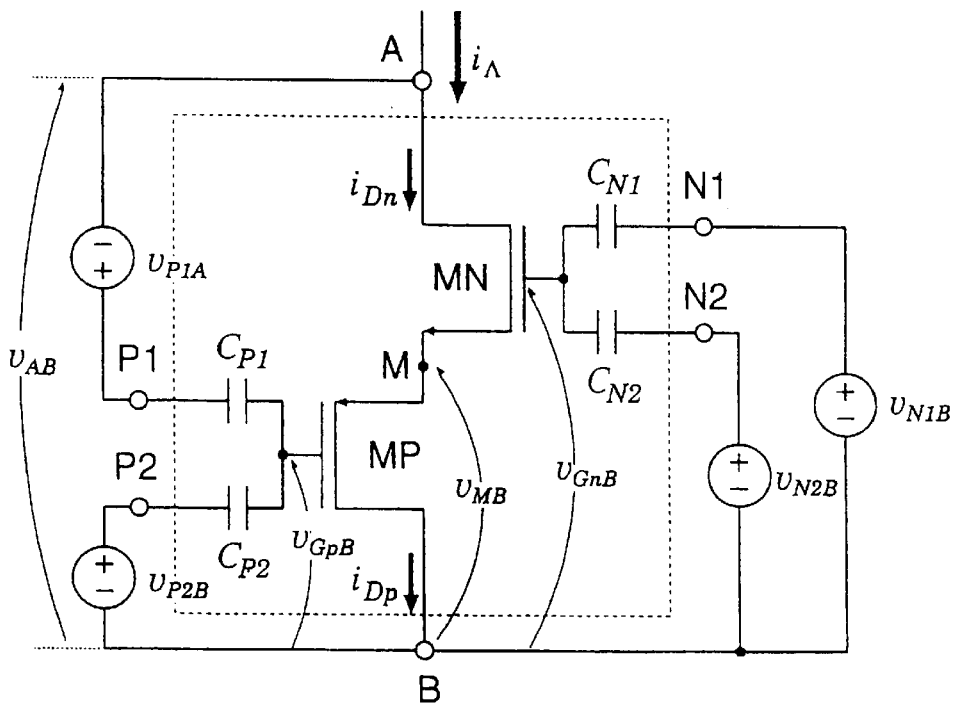
FIG. 4 is a diagram in relation to the embodiment of the present invention, showing a basic circuit which realizes a Λ-type I-V characteristic.

FIG. 4 is a basic circuit for realizing Λ-shaped I-V characteristics showing an embodiment of the present invention, where the section within a broken line is a core circuit.

Voltage sources are added to the input terminals of the core circuit as in FIG. 4 to thereby obtain Λ-shaped I-V characteristics between the terminals A and B. In this case, when the respective node points assume the voltages shown in FIG. 4 with respect to the terminal B, the gate terminal voltages vane and $v_{GnB}$ and $v_{GpB}$ of MN and MP are obtained, by use of Eqs. (2) and (9), from the following equations.

$$v_{GnB} = \frac{C_{N1}v_{N1B} + C_{N2}v_{N2B}}{C_{N1} + C_{N2}} \quad (15)$$

$$v_{GpB} = \frac{C_{P1}(v_{AB} + v_{P1A}) + C_{P2}v_{P2B}}{C_{P1} + C_{P2}} \quad (16)$$

Furthermore, the gate-source voltage $v_{GSn}$, the drain source voltage $v_{DSn}$ of MN, and those of MP, i.e., $v_{GSp}$ and $v_{DSp}$ respectively, are given by following equations.

$$v_{GSn} = v_{GnB} - v_{MA} \quad (17)$$

$$v_{DAn} = v_{AB} - v_{MA} \quad (18)$$

$$v_{GSp} = v_{GpB} - v_{MB} \quad (19)$$

$$v_{DSp} = -v_{MB} \quad (20)$$

where $v_{MB}$ is the voltage of a node M with respect to the terminal B.

The drain current of MN, $i_{Dn}$, and that of MP, $i_{Dp}$, are expressed as follows for three operating regions; i e., the cutoff, triode, and saturation regions, by use of equations derived in section [1].
For MN;
1. MN is in the cutoff region when $v_{GSn} < V_{tn}$. Therefore, from Eq. (17), when $v_{GnB} - v_{MB} < V_{tn}$, $\quad (21)$ $i_{Dn} = 0. \quad (22)$ 2. When $v_{GSn} \geq V_{tn}$, i.e., $v_{GnB} - v_{MB} \geq V_{tn}$, $\quad (23)$ MN is in the inversion region. Further, in this case:
(a) when $v_{DSn} < v_{GSn} - V_{tn}$, MN is in the triode region. That is, from Eqs. (17) and (18).

when $v_{AB} < v_{GnB} - V_{tn}$, $\quad (24)$ $$i_{Dn} = K_n\{2(v_{GSn} - V_{tn})v_{DSn} - v_{DSn}^2\} \quad (25)$$

$$= K_n\{2(v_{GnB} - v_{MB} - V_{tn})(v_{AB} - v_{MB}) - (v_{AB} - v_{MB})^2\}. \quad (26)$$

(b) when $v_{DSn} \geq v_{GSn} - V_{tn}$, MN is in the saturation region. That is, when $v_{AB} \geq v_{GnB} - V_{tn}$, $\quad (27)$ $$i_{Dn} = K_n(v_{GSn} - V_{tn})^2 \quad (28)$$

$$= K_n(v_{GnB} - v_{MB} - V_{tn})^2. \quad (29)$$

For MP;
1. MP is in the cutoff region when $v_{GSp} > V_{tp}$. Therefore, from Eq. (19), when $v_{GpB} - v_{MB} > V_{tp}$, (30)

$i_{DP} = 0.$ (31)

2. MP is in the inversion region when $v_{GSp} \leq V_{tp}$. Moreover,
   (a) If $v_{DSp} > v_{GSp} - V_{tp}$, MP is in the triode region. That is, from Eqs. (19) and (20), when $v_{GpB} < V_{tp}$, (32)

$i_{Dp} = K_p\{2(v_{MB} - v_{GpB} + V_{tp})v_{MB} - v^2_{MB}\}.$ (33)

(b) When $v_{DSp} \leq v_{GSp} - V_{tp}$, MP is in the saturation region. That is, when $v_{GpB} \geq V_{tp}$, (34)

$i_{Dp} = K_P(v_{GpB} - v_{MB} - V_{tp})^2.$ (35)

By use of the above results together with the condition that $i_A = i_{Dn} = i_{Dp}$, $v_{MB}$ is given as follows. In the following, $K_n = K_p = K$ is assumed for simplicity.
1. When both MN and MP operate in the triode region, from Eqs. (26) and (33), $v_{MA} = \{2(V_{tn} - v_{GnB})v_{AB} + v^2_{AB}\}/P$ (36)

where $P = 2(v_{GpB} - v_{GnB} + V_{tn} - V_{tp})$ (37)

(this is the same in the following description).
2. When MN operates in the triode region and MP operates in the saturation region, from Eqs. (26) and (35), $v_{MB} = \{v^2_{AB} + 2(V_{tn} - v_{GnB})v_{AB} + (v_{GpB} - V_{tp})^2\}/P.$ (38)

3. When MN operates in the saturation region and MP operates in the triode region, from Eqs. (29) and (33), $v_{MB} = -(v_{GnB} - V_{tn})^2/P.$ (39)

4. When both MN and MP operate in the saturation region, from Eqs. (29) and (35), $v_{MB} = \{(v_{GpB} - V_{tp})^2 - (v_{GnB} - V_{tn})^2\}/P.$ (40)

From the above equations, current $i_A$ of FIG. 4 is given as follows, However, in the following, $K_n = K_p = K$ is assumed for simplicity.

1. When $v_{GnB} - v_{MB} < V_{tn}$ or $v_{GpB} - v_{MB} > V_{tp}$, $i_A = 0.$ (42)

2. When $v_{GnB} - v_{MB} \geq V_{tn}$ or $v_{GpB} - v_{MB} \leq V_{tp}$, $i_A \neq 0.$ (42)

Moreover,
(a) When $v_{AB} < v_{GnB} - V_{tn}$ and $v_{GpB} < V_{tp}$, $i_A = K\{2(v_{GnB} - v_{MB} - V_{tn})(v_{AB} - v_{MB}) - (v_{AB} - v_{MB})^2\}$ (43)

$v_{MB} = \{2(V_{tn} - v_{GnB})v_{AB} + v^2_{AB}\}/P.$ (44)

(b) When $v_{AB} < v_{Gna} - V_{tn}$ and $v_{GpB} \geq V_{tp}$, $i_A = K\{2(v_{GnB} - v_{MB} - V_{tn})(v_{AB} - v_{MB}) - (v_{AB} - v_{MB})^2\}$ (45)

$v_{MB} = \{v^2_{AB} + 2(V_{tn} - v_{GnB})v_{AB} + (v_{GpB} - V_{tp})^2\}/P.$ (46)

(c) When $v_{AB} \geq v_{GnB} - V_{tn}$ and $v_{GpB} < V_{tp}$, $i_A = K(v_{GnB} - v_{MA} - V_{tn})^2$ (47)

$v_{MB} = -\{(v_{GpB} - V_{tp})^2\}/P.$ (48)

(d) When $v_{AB} \geq v_{GnB} - V_{tn}$ and $v_{Gpa} \geq V_{tp}$, $i_A = K(v_{GnB} - v_{MB} - V_{tn})^2$ (49)

$v_{MB} = \{(v_{GpB} - V_{tp})^2 - (v_{GnB} - V_{tn})^2\}/P.$ (50)

[2-3] Basic Circuit Configuration for Realizing V-shaped I-V Characteristics

Figure 5:
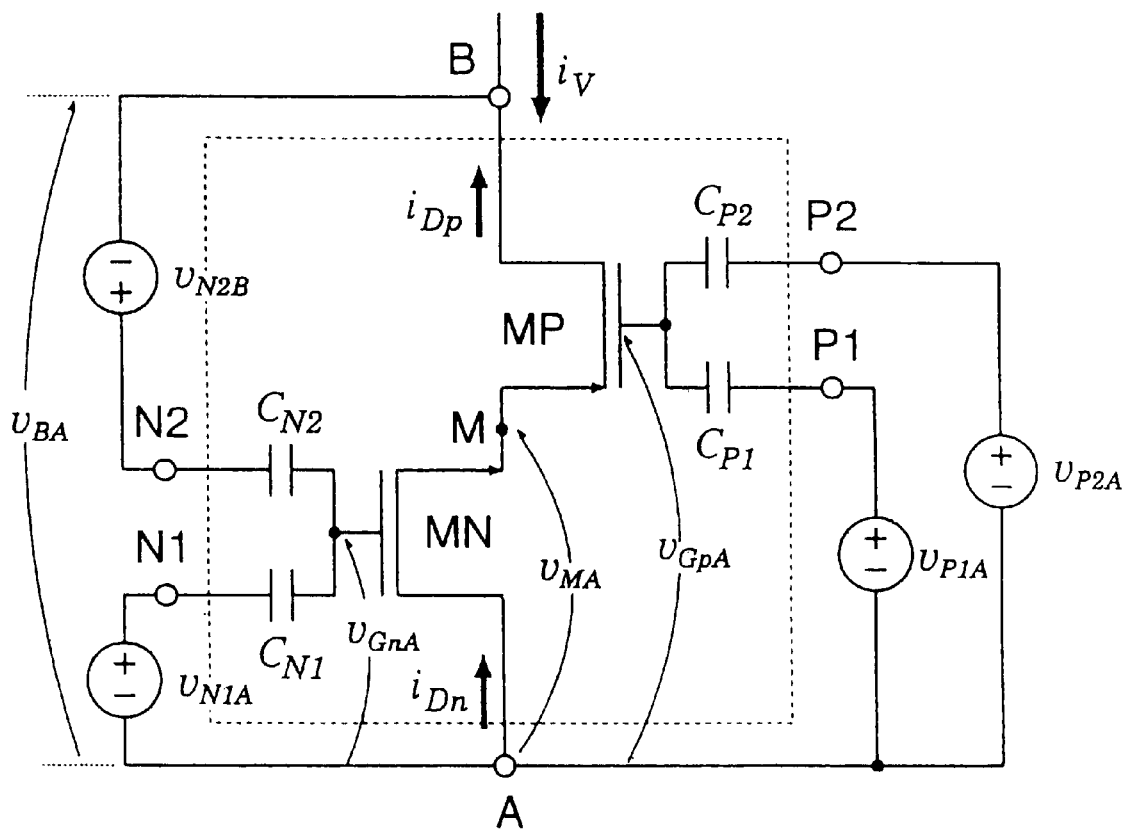
FIG. 5 is a diagram in relation to the embodiment of the present invention, showing a basic circuit which realizes a V-type I-V characteristic.

Next, as shown in FIG. 5, voltages are applied to the terminals of the core circuit mentioned under section [2-1]. Note that the circuit in FIG. 5 has the same core circuit as in the circuit of FIG. 4, but is placed upside down. V-shaped I-V characteristics can be realized between the terminals B and A in this circuit. In this case, as shown in FIG. 5, when the respective node points assume the voltages shown in FIG. 5 with respect to the terminal A, the gate terminal voltages $v_{GnA}$ and $v_{GpA}$ of MN and MP are obtained, by use of Eqs. (2) and (9), from the following equations.

$v_{GnA} = \{C_{N1A}v_{N1A} + C_{N2}(v_{BA} + v_{N2B})\}/(C_{N1} + C_{N2})$ (51)

$v_{GpA} = (C_{P1}v_{P1A} + C_{P2}v_{P2A})/(C_{P1} + C_{P2})$ (52)

In addition, the gate-source voltage $v_{GSn}$ and the drain-source voltage $v_{DSn}$ of MN and the gate-Source voltage $v_{GSp}$ and the drain-source voltage $v_{DSp}$ of MP are given by the following equations.

$v_{GSn} = v_{GnA} - v_{MA}$ (54)

$v_{DSn} = -v_{MA}$ (54)

$v_{GSp} = v_{GpA} - v_{MA}$ (55)

$v_{DSp} = v_{BA} - v_{MA}$ (56)

In the same manner as in section [2-2], currents $i_v = -i_{Dn} = -i_{Dp}$ in FIG. 5 can be obtained as follows. However, $K_n = K_p = K$ is assumed for simplicity.
1. When $v_{GnA} - v_{MA} < V_{tn}$ (MN: cutoff) or $v_{GpA} - v_{MA} > V_{tp}$ (MP: cutoff), $i_v = 0.$ (57)

2. When $v_{GnA} - v_{MA} \geq V_{tn}$ and $v_{GpA} - v_{MA} \leq V_{tp}$ (MN, MP: inversion), $i_v \neq 0.$ (58)

Moreover,
(a) When $v_{GnA} > V_{tn}$ and $v_{BA} > v_{GpA} - V_{tp}$ (MN, MP: triode), $i_v = -K\{2(v_{MA} - v_{GnA} + V_{tn})v_{MA} - v^2_{MA}\}$ (59)

$v_{MA} = \{2(v_{GpA} - V_{tp})v_{BA} - v^2_{BA}\}/P.$ (60)

(b) When $v_{GnA} > V_{tn}$ (MN: triode) and $v_{BA} \leq v_{GpA} - V_{tp}$ (MP: saturation), $$i_v = -K\{2(v_{MA} - v_{GnA} + V_{tn})v_{MA} - v^2{}_{MA}\} \tag{61}$$

$$v_{MA} = \{(v_{GpA} - V_{tp})^2\}/P \tag{62}$$

(c) When $v_{GnA} \leqq V_{tn}$ (MN: saturation) and $v_{BA} > v_{GpA} - V_{tp}$ (MP: triode), $$i_v = -K(v_{GnA} - v_{MA} - V_{tn})^2 \tag{63}$$

$$v_{MA} = \{2(v_{OpA} - V_{tp})v_{BA} - v^2{}_{BA} - (v_{GnA} - V_{tn})^2\}/P \tag{64}$$

(d) When $v_{GnA} \leqq V_{tn}$ and $v_{BA} \leqq v_{GpA} - V_{tp}$ (MN, MP: saturation), $$i_v = -K(v_{GnA} - v_{MA} - V_{tn})^2 \tag{65}$$

$$v_{MA} = \{(v_{GpA} - V_{tp})^2 - (v_{GnA} - V_{tn})^2\}/P \tag{66}$$

[2-4] Improvement on Λ-Type I-V Nonlinear Resistor Circuit

Next will be described an improvement which is performed on the Λ-type I-V nonlinear resistor basic circuit described in section [2-2] and which Provides broader I-V characteristics.

Figure 6:
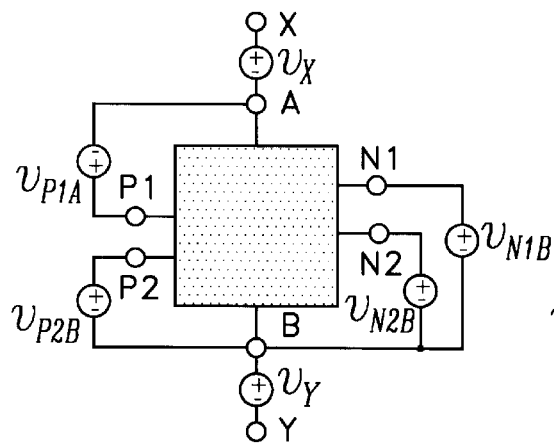
FIGS. 6(a)–6(p) are diagrams in relation to the embodiment of the present invention, each showing a nonlinear resistor circuit which realizes a A-type I-V characteristic.
Figure 6:
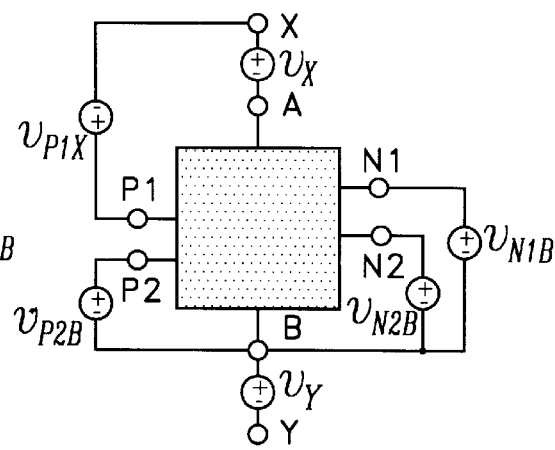
Figure 6:
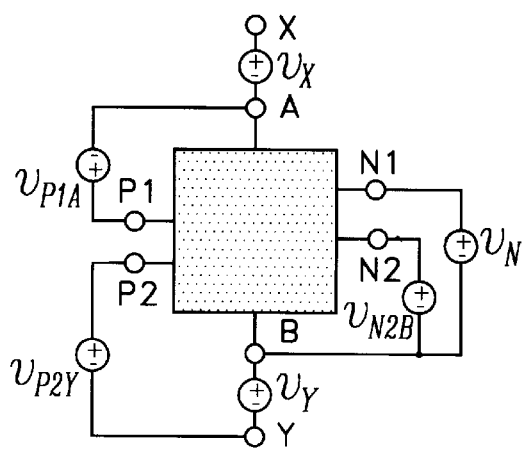
Figure 6:
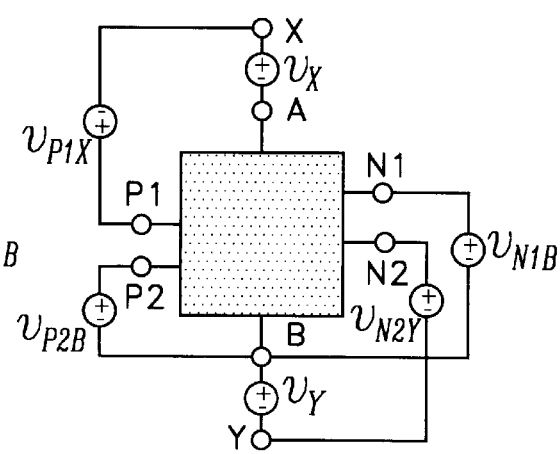
Figure 6:
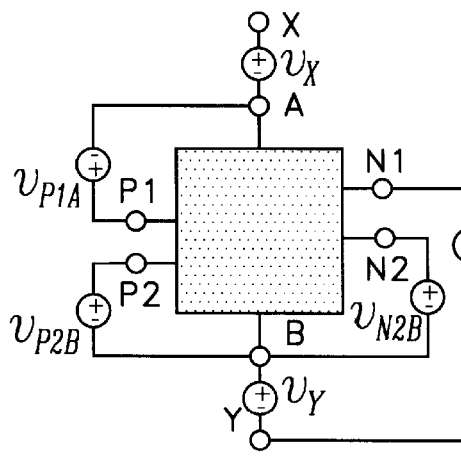
Figure 6:
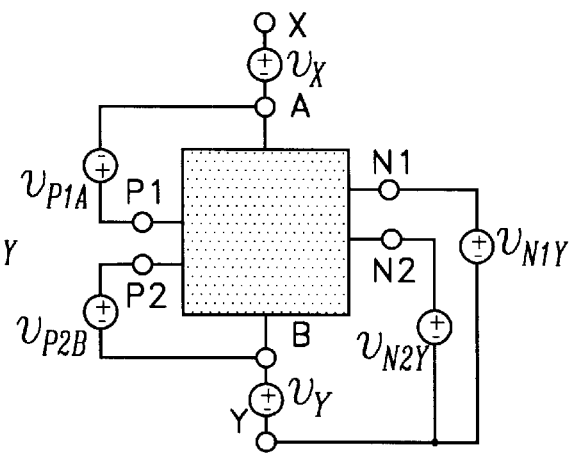
Figure 6:
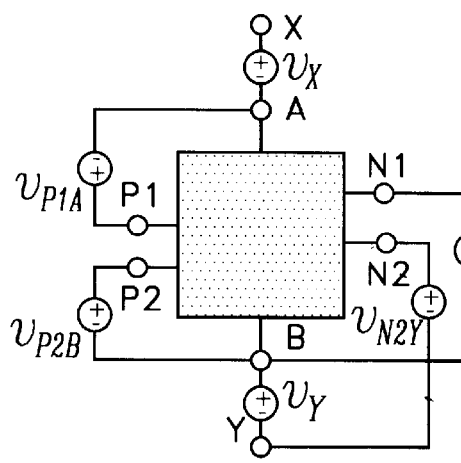
Figure 6:
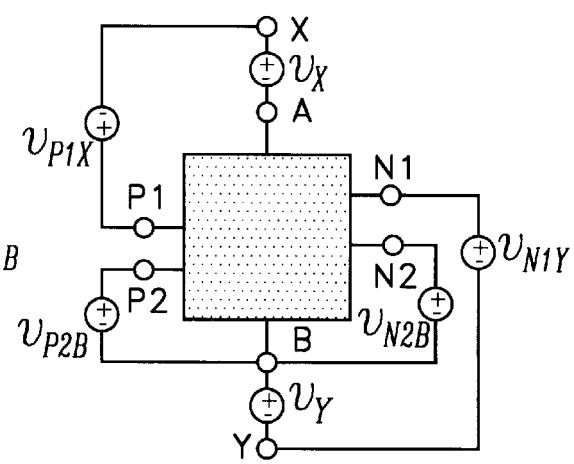

Voltage sources $v_X$ and $v_Y$ are added to the terminals A and B in the circuit of FIG. 4, respectively. Sixteen different combinations are possible for connecting the voltages sources, as shown in FIGS. 6(a)–6(p). The shaded box in each of FIGS. 6(a)–6(p) represents the core circuit shown in FIG. 3. Since the circuits of FIGS. 6(a)–6(p) have similar characteristics, only the circuit of FIG. 6(f) will be described in detail as an example. The circuit is shown in FIG. 7.

Figure 7:
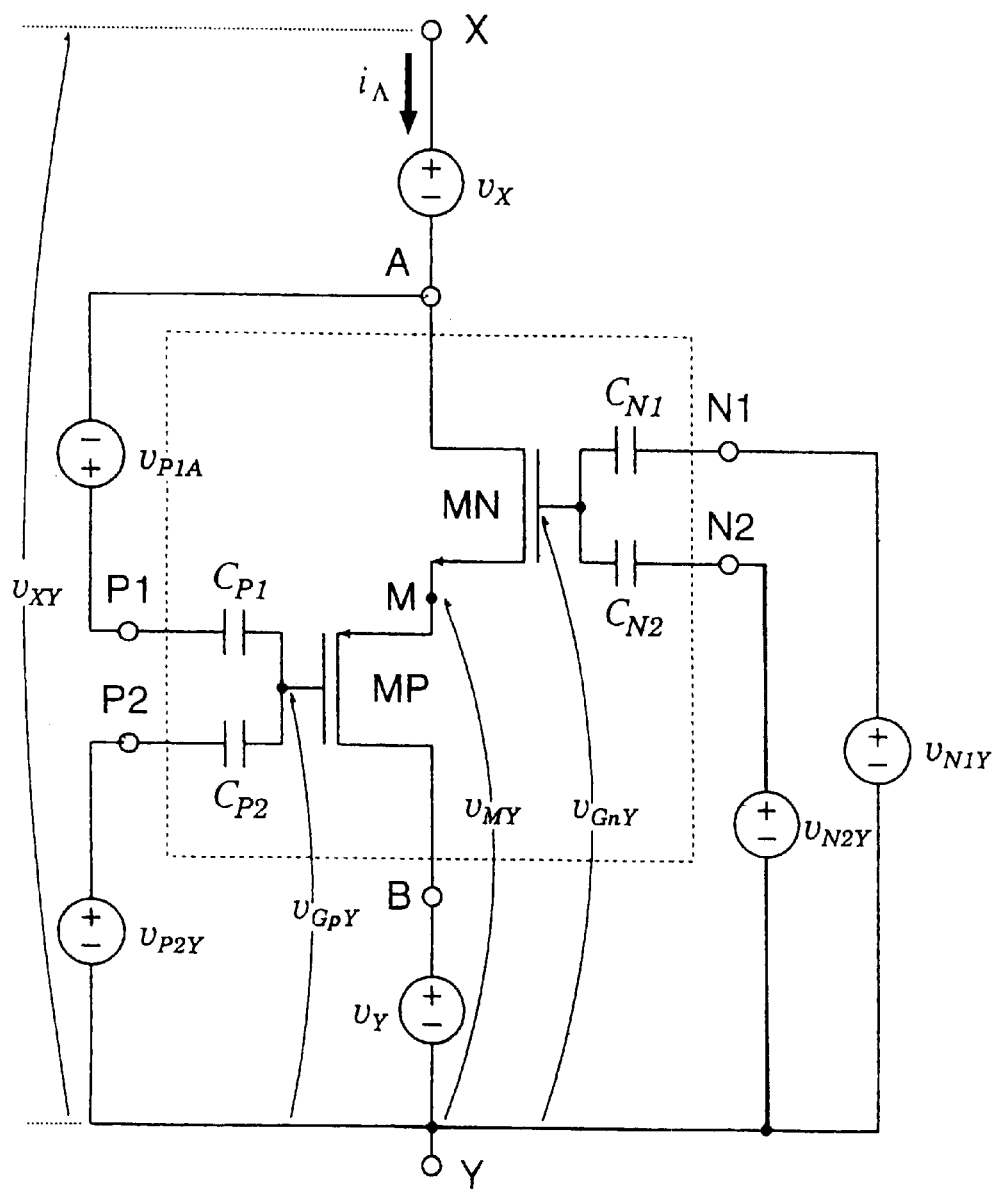
FIG. 7 is a diagram in relation to another embodiment of the present invention, showing an exemplary nonlinear resistor circuit which realizes a Λ-type I-V characteristic.

Voltages of respective nodes with respect to the terminal Y as depicted in FIG. 7 are given by $$v_{GnY} = (C_{N1}v_{N1Y} + C_{N2}v_{N2Y})/(C_{N1} + C_{N2}) \tag{67}$$

$$v_{GpY} = \{C_{P1}(v_{XY} - v_X + v_{P1A}) + C_{P2}v_{P2Y}\}/(C_{P1} + C_{P2}) \tag{68}$$

$$v_{DSn} = v_{XY} - v_X - v_{MY} \tag{69}$$

$$v_{DSp} = v_Y - v_{MY} \tag{70}$$

$$v_{GSn} = v_{GnY} - v_{MY} \tag{71}$$

$$v_{GSp} = v_{GpY} - v_{MY} \tag{72}$$

Moreover, the following voltage relationships are found between FIG. 4 and FIG. 7.

$$v_{AB} = v_{XY} - v_X - v_Y \tag{73}$$

$$v_{MB} = v_{MY} - v_Y \tag{74}$$

$$v_{N1B} = v_{N1Y} - v_Y \tag{75}$$

$$v_{N2B} = v_{N2Y} - v_Y \tag{76}$$

$$v_{P2B} = v_{P2Y} - v_Y \tag{77}$$

$$v_{GnB} = v_{GnY} - v_Y \tag{78}$$

$$v_{GpB} = v_{GpY} - v_Y \tag{79}$$

By substitution of the above equations into corresponding equations in section [2-2], equations for operations of circuit of FIG. 7 are obtained as follows. Again, $K_n = K_p = K$ is assumed for simplicity in the following.

1. When $v_{GnY} - v_{MY} < V_{tn}$ (MN: cutoff) or $v_{GpY} - v_{MY} > V_{tp}$ (MP: cutoff), $$i_\Lambda = 0 \tag{80}$$

2. When $v_{GnY} - v_{MY} \geqq V_{tp}$ and $v_{GpY} - v_{MY} \leqq V_{tp}$ (MN, MP: inversion), $$i_\Lambda \neq 0 \tag{81}$$

Moreover, (a) When $v_{XY} < v_X + v_{GnY} - V_{tn}$ and $v_{GpY} < v_Y + V_{tp}$ (MN, MP: triode), $$i_\Lambda = K\{2(v_{GnY} - v_{MY} - V_{tn})(v_{XY} - v_X - v_{MY}) - (v_{XY} - v_X - v_{MY})^2\} \tag{82}$$

$$v_{MY} = [v^2{}_{XY} + 2(V_{tn} + v_{GnY})v_{XY} + \{2(v_{GnY} - v_{XY} - V_{tn}) + v_X\}v_X + \{2(v_{GpY} - V_{tp}) - v_Y\}v_Y]/Q \tag{83}$$

where $$Q = 2(v_{GpY} - v_{GnY} + V_{tn} - V_{tp}) \tag{84}$$

(This is the same in the following description.)

(b) When $v_{XY} < v_X + v_{GnY} - V_{tn}$ (MN: triode) and $v_{GpY} \geqq v_Y + V_{tp}$ (MP: saturation), $$i_\Lambda = K\{2(v_{GnY} - v_{MY} - V_{tn})(v_{XY} - v_X - v_{MY}) - (v_{XY} - v_X - v_{MY})^2\} \tag{85}$$

$$v_{MY} = [v^2{}_{XY} + 2(V_{tn} + v_{GnY})v_{XY} + \{2(v_{GnY} - v_{XY} - V_{tn}) + v_X\}v_X + (v_{GpY} - V_{tp})^2]/Q \tag{86}$$

(c) When $v_{XY} \geqq v_X + v_{GnY} - V_{tn}$ (MN: saturation) and $v_{GpY} \geqq v_Y + V_{tp}$ (MP: triode), $$i_\Lambda = K(v_{GnY} - v_{MY} - V_{tn})^2 \tag{87}$$

$$v_{MY} = [\{2(v_{GpY} - V_{tp}) - v_Y\}v_Y - (v_{GnY} - V_{tn})^2]/Q \tag{88}$$

(d) When $v_{XY} \geqq v_X + v_{GnY} - V_{tn}$ and $v_{GpY} \geqq v_Y + V_{tp}$ (MN, MP: saturation), $$i_\Lambda = K(v_{GnY} - v_{MY} - V_{tn})^2 \tag{89}$$

$$v_{MA} = \{(v_{GpY} - V_{tp})^2 - (v_{GnY} - V_{tn})^2\}/Q \tag{90}$$

[2-5] Improvement on V-type I-V Nonlinear Resistor Circuit

In a similar manner as in the previous section, the V-type I-V nonlinear resistor basic circuit described in section [2-3] was improved.

Figure 8:
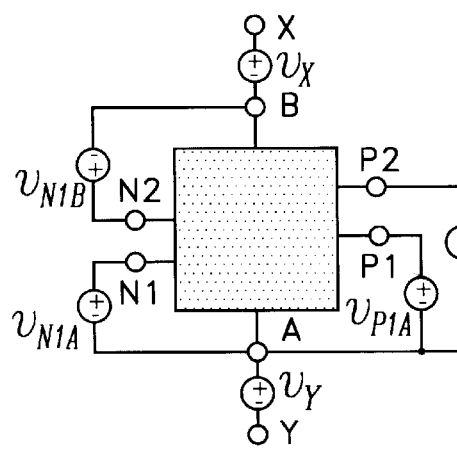
FIGS. 8(a)–8(p) are diagrams in relation to the embodiment of the present invention, each showing a nonlinear resistor circuit which realizes a V-type I-V characteristic.
Figure 8:
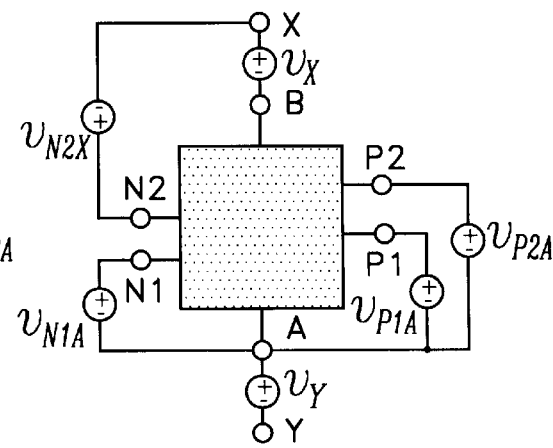
Figure 8:
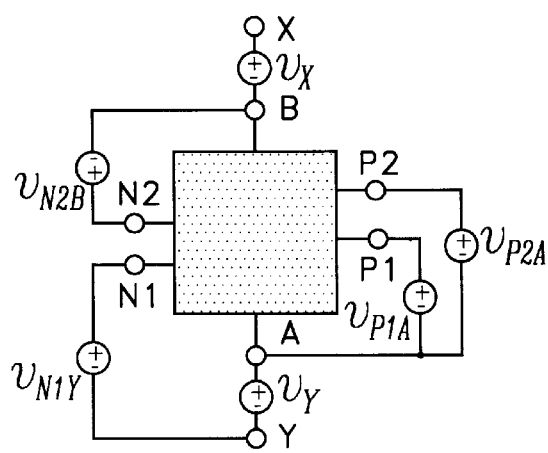
Figure 8:
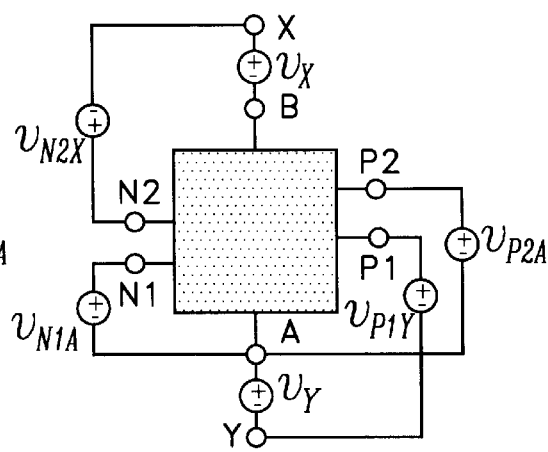
Figure 8:
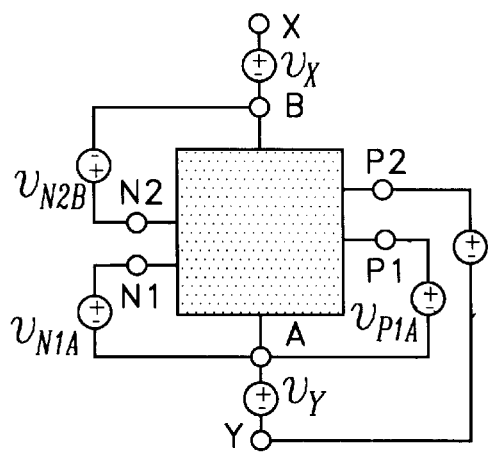
Figure 8:
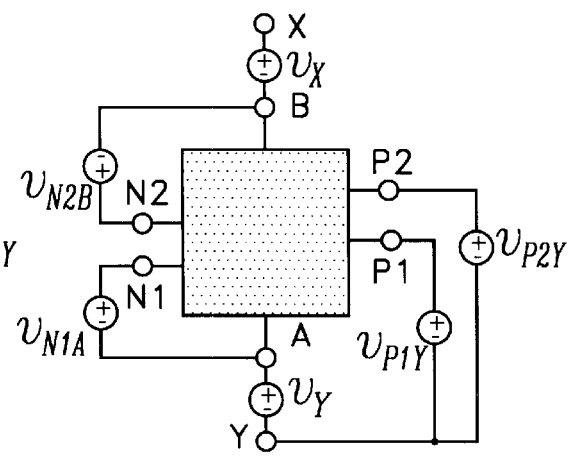
Figure 8:
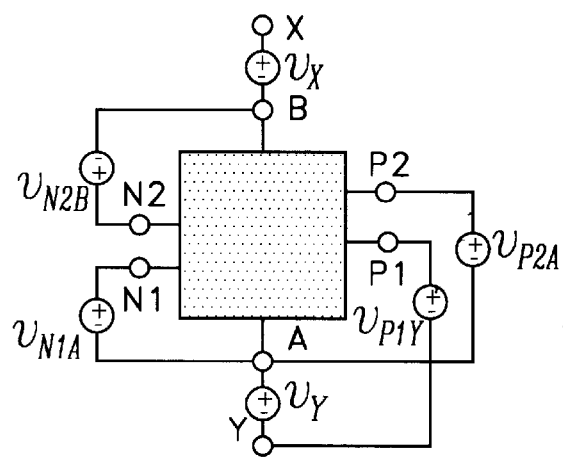
Figure 8:
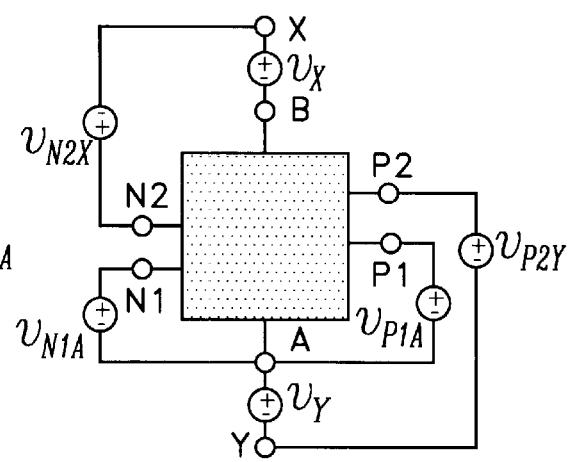
Figure 8:
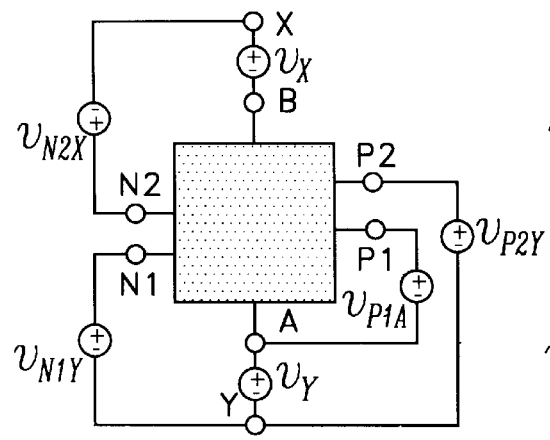
Figure 8:
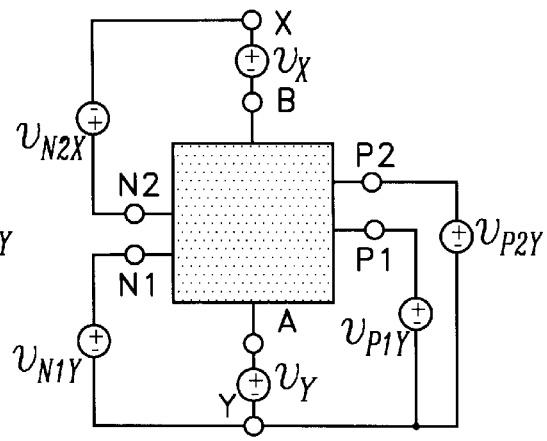
Figure 8:
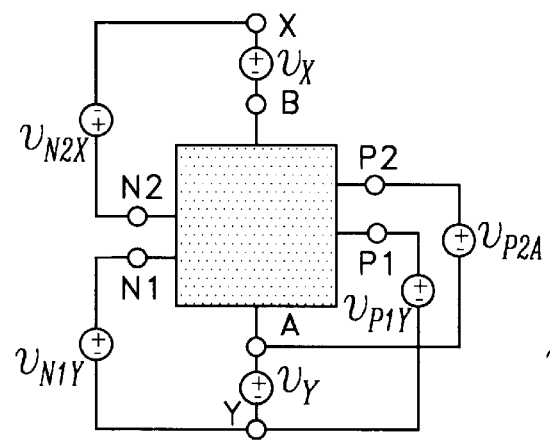
Figure 8:
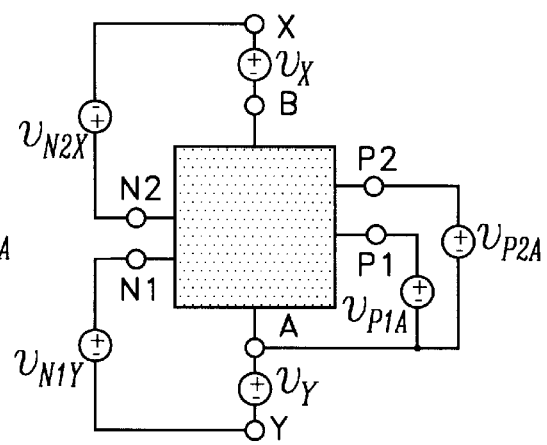

Voltage sources $v_X$ and $v_Y$ are added to the terminals A and B in the circuit of FIG. 5, respectively. Sixteen different combinations are possible for connecting the voltages sources, as shown in FIGS. 8(a)–8(p). The shaded box in each of FIGS. 8(a)–8(p) represents the core circuit shown FIG. 3. Note that the core circuit is shown upside down. Since the circuits of FIGS. 8(a)–8(p) have similar characteristics, only the circuit of FIG. 8(f) will be described in detail as an example. The circuit is shown in FIG. 9.

Figure 9:
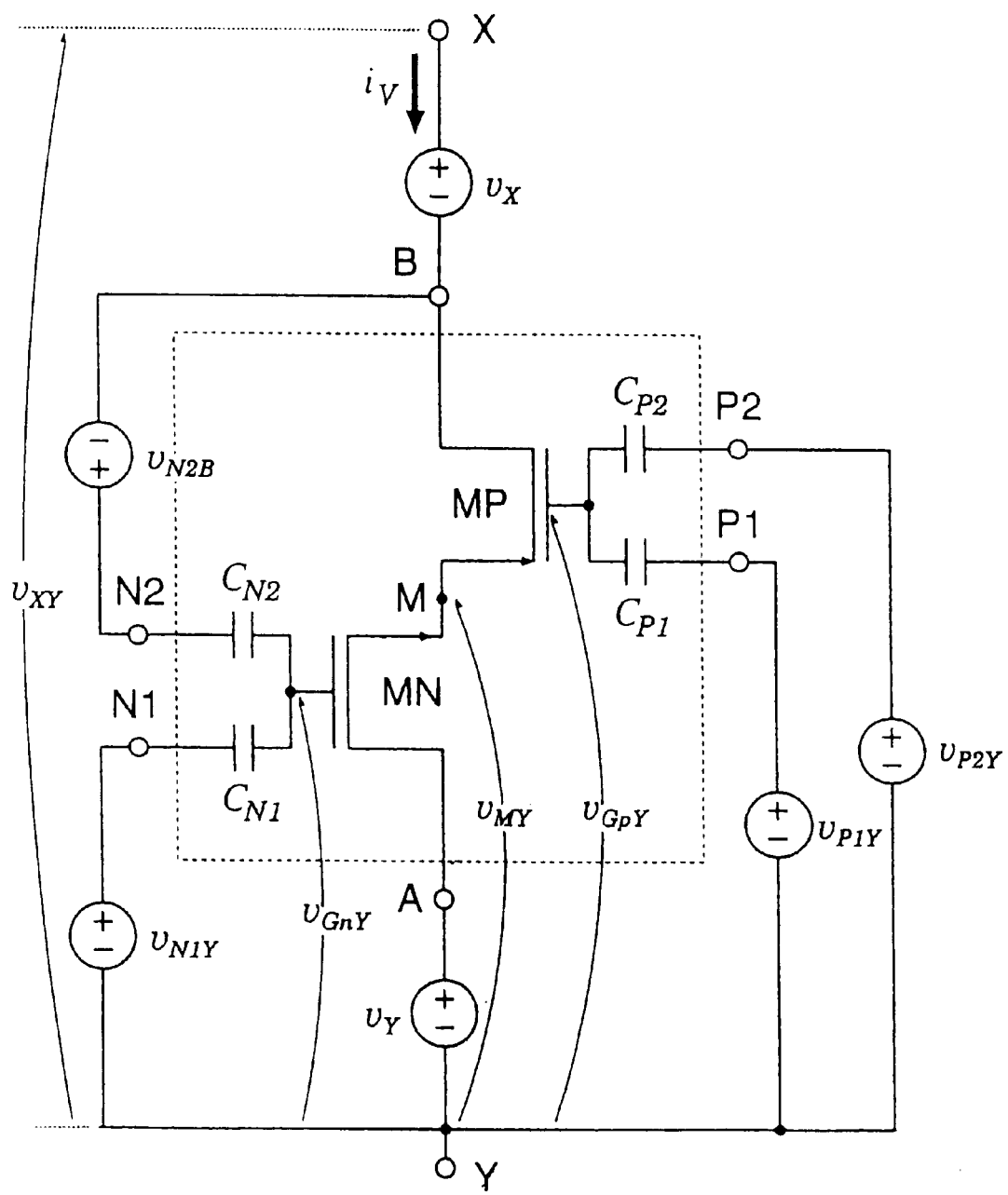
FIG. 9 is a diagram in relation to the embodiment of the present invention, showing an exemplary nonlinear resistor circuit which realizes a V-type I-V characteristic.

Voltages of respective nodes with respect to the terminal Y as depicted in FIG. 9 are given by $$v_{GnY} = \{C_{N1}v_{N1Y} + C_{N2}(v_{XY} - v_X + v_{N2B})\}/(C_{N1} + C_{N2}) \tag{91}$$

$$v_{GpY} = \{C_{P1}v_{P1Y} + C_{P2}v_{P2Y}\}/(C_{P1} + C_{P2}) \tag{92}$$

$$v_{DSn} = v_Y - v_{MY} \tag{93}$$

$$v_{DSp} = v_{XY} - v_X - v_{MY} \tag{94}$$

$$v_{GSn} = v_{GnY} - v_{MY} \tag{95}$$

$$v_{GSp} = v_{GpY} - v_{MY} \tag{96}$$

Moreover, the following voltage relationships are found between FIG. 5 and FIG. 9.

$$v_{BA} = v_{XY} - v_X - v_Y \tag{97}$$

$$v_{MA}=v_{MY}-v_Y \qquad (98)$$

$$v_{N1A}=v_{N1Y}-v_Y \qquad (99)$$

$$v_{P1A}=v_{P1Y}-v_Y \qquad (100)$$

$$v_{P2A}=v_{P2Y}-v_Y \qquad (101)$$

$$v_{GnA}=v_{GnY}-v_Y \qquad (102)$$

$$v_{GpA}=v_{GpY}-v_Y \qquad (103)$$

By substitution of the above equations into corresponding equations in section [2-3], operation equations of the circuit of FIG. 9 are obtained as follows. In the following, $K_n=K_p=K$ is assumed for simplicity.

1. When $v_{GnY}-v_{MY}<V_{tn}$ (MN: cutoff) or $v_{GpY}-v_{MY}>V_{tp}$ (MP: cutoff), $$i_v=0 \qquad (104)$$

2. When $v_{GnY}-v_{MY} \geq V_{tn}$ and $v_{CpY}-v_{MY} \leq V_{tp}$ (MN, MP: inversion), $$i_v \neq 0. \qquad (105)$$

Moreover, (a) When $v_Y<v_{GnY}-V_{tn}$ and $v_{XY}>v_X+v_{GpY}-V_{tp}$ (MN, MP: triode), $$i_v=K\{2(v_{GnY}-v_{MY}-V_{tn})(v_Y-v_{MY})-(v_Y-v_{MY})^2\} \qquad (106)$$

$$v_{MY}-[-v^2{}_{XY}+2(v_{GpY}-V_{tp})v_{XY}+\{2(v_{XY}-v_{GpY}+V_{tp})-v_X\}v_X+\{2(V_{tn}-v_{GnY})+v_Y\}v_Y]/Q \qquad (107)$$

(b) When $v_Y<v_{GnY}-V_{tn}$ (MN: triode) and $v_{XY} \leq v_X+v_{GpY}-V_{tp}$ (MP: saturation), $$i_v=K\{2(v_{GnY}-v_{MY}-V_{tn})(v_Y-v_{MY})-(v_Yv_{MY})^2\} \qquad (108)$$

$$v_{MY}=[2(V_{tn}-v_{GnY})+v_Y)v_Y+(v_{GpY}-V_{tp})^2]/Q \qquad (109)$$

(c) When $v_Y \geq v_{GnY}-V_{tn}$ (MN: saturation) and $v_{XY}>v_X+v_{GpY}-V_{tp}$ (MP: triode), $$i_v=K(v_{GnY}-v_{MY}-V_{tn})^2 \qquad (110)$$

$$v_{MY}=[-v^2{}_{XY}+2(v_{GpY}-V_{tp})v_{XY}+\{2(v_{XY}-v_{GpY}+V_{tp})-v_X\}v_X-(v_{GnY}-V_{tn})^2]/Q \qquad (111)$$

(d) When $v_Y \geq v_{GnY}-V_{tn}$ and $v_{XY} \leq v_X+v_{GpY}-V_{tp}$ (MN, MP: saturation), $$i_v=K(v_{GnY}-v_{MY}-V_{tn})^2 \qquad (112)$$

$$v_{MY}=\{(v_{GpY}-V_{tp})^2-(v_{GnY}-V_{tn})^2\}/Q \qquad (113)$$

[3] Numerical Simulations

I-V characteristics of circuits of FIG. 7 were calculated through computer simulations utilizing the equations obtained in section [2]. Device parameters used in the simulations are given below, $$K_n=K_p=300 \ \mu A/V^2$$

$$V_{tn}=0.7 \ V$$

$$v_{tp}=-0.7 \ V$$

$$C_{N1}=C_{N2}=C_{P1}C_{P2}=0.1 \ \mu F$$

Figure 10:
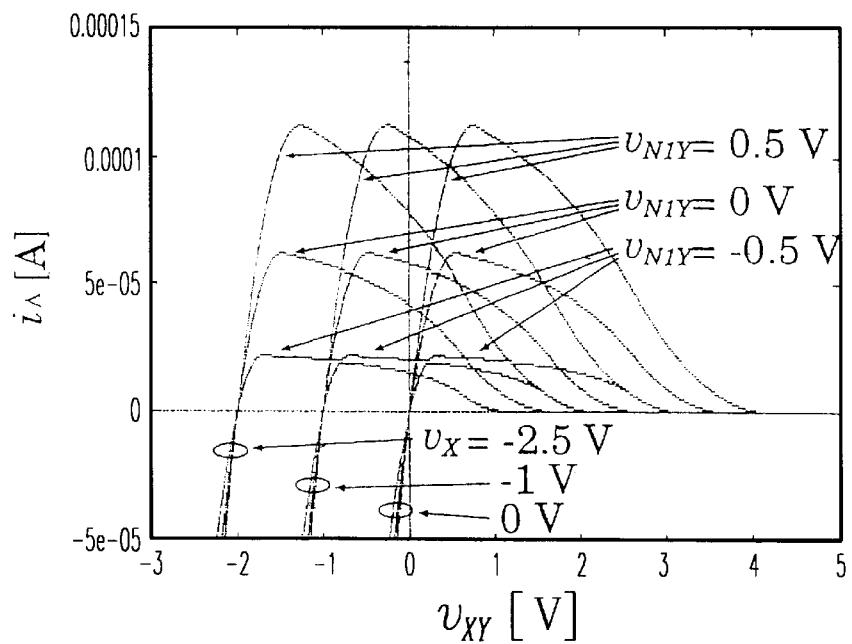
FIG. 10 is a graph showing results of a simulation in which variation in $i_\Lambda$ with $v_{XY}$ in the circuit of FIG. 7 was simulated, where $v_{N1Y}$ and $v_X$ are parameters.

FIG. 10 shows $i_\Lambda$-$v_{XY}$ characteristics, where $v_{N1Y}$ and $v_X$ are parameters, $v_{P2Y}=-4$ V, $v_{N2Y}=2.5$ V, and $v_{P1A}=v_Y=0$ V.

Figure 11:
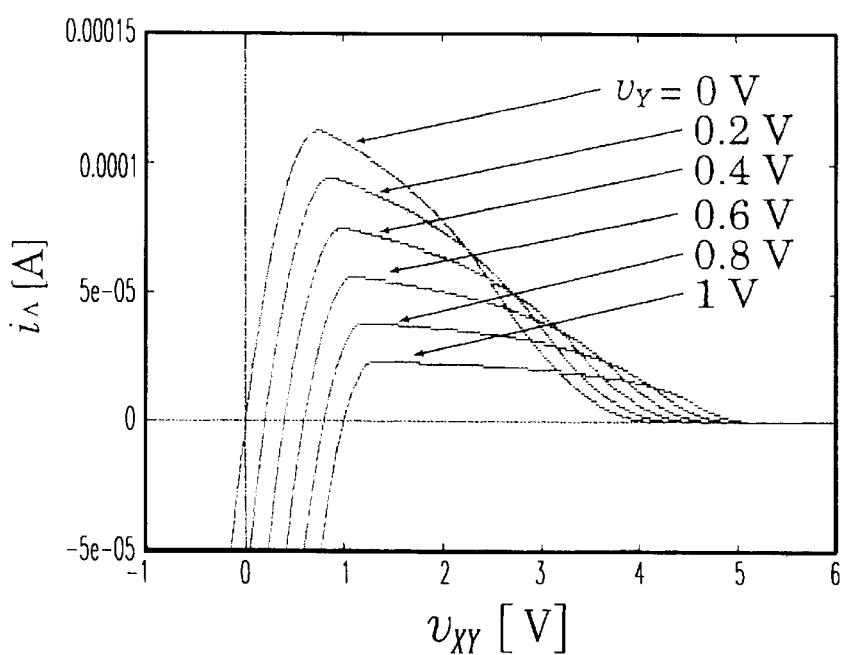
FIG. 11 is a graph showing $i_\Lambda$-$v_{XY}$ characteristics of the circuit of FIG. 7, where $v_Y$ is a parameter.

Further, FIG. 11 shows $i_\Lambda$-$v_{XY}$ characteristics, where $v_Y$ is a parameter, $v_{P2Y}=-4$ V, $v_{N1Y}=3$ V, $v_{P1A}=v_X=0$ V, and $v_{N2Y}=v_Y$.

Next, results of a simulation performed for the circuit of FIG. 9 will be described.

FIG. 11 shows $i_\Lambda$-$v_{XY}$ characteristics of the circuit of FIG. 7, where $v_Y$ is a parameter.

Figure 12:
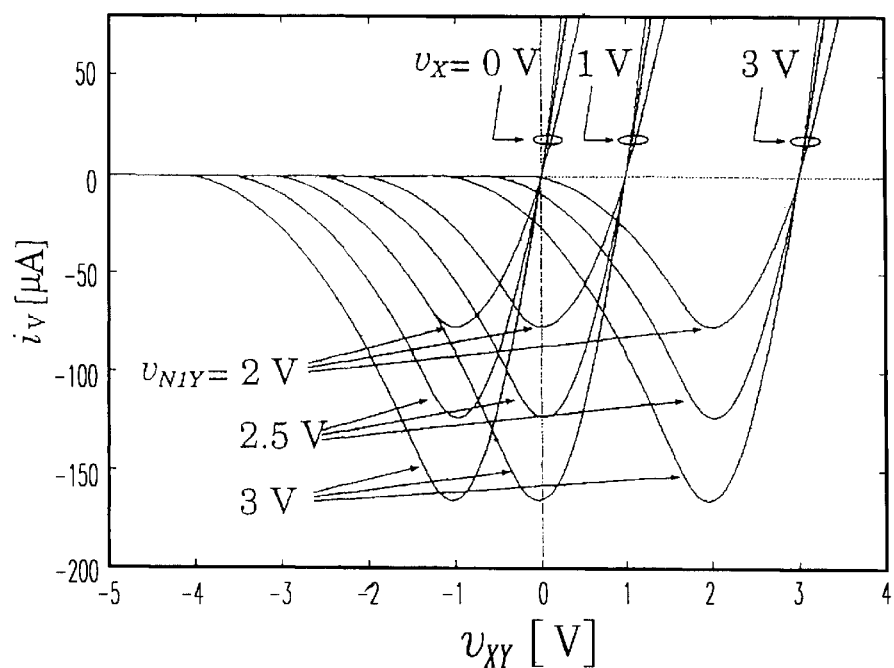
FIG. 12 is a graph showing results of a simulation in which variation in $i_V$ with $v_{XY}$ in the circuit of FIG. 9 was simulated, where $v_{N1Y}$ and $v_X$ are parameters.

FIG. 12 shows $i_v$-$v_{XY}$ characteristics, where $v_{N1Y}$ and $v_X$ are parameters, $v_{P2Y}=-4$ V, and $v_{P1Y}=v_{N2B}=v_Y=0$ V.

Figure 13:
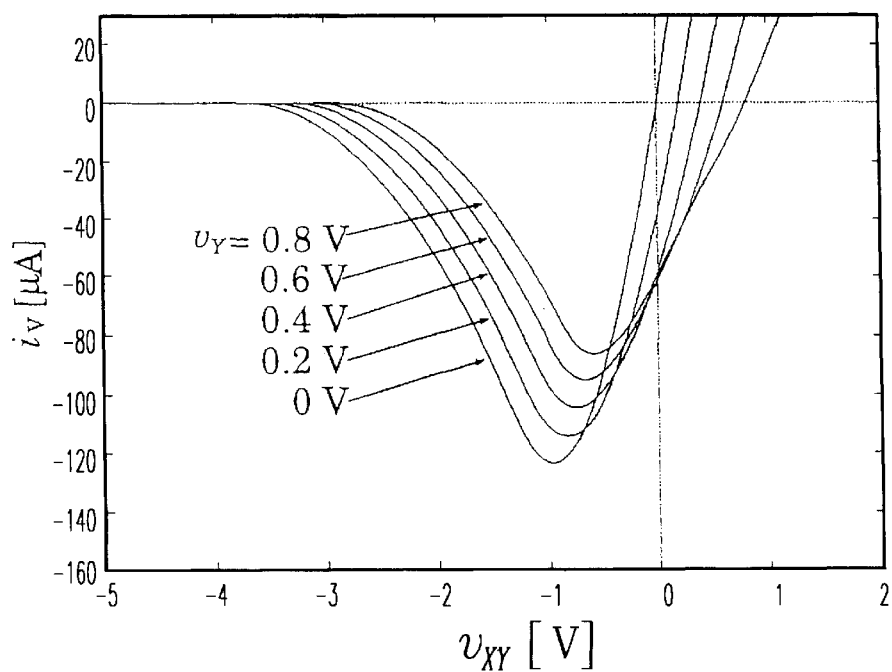
FIG. 13 is a graph showing $i_V$-$v_{XY}$ characteristics of the circuit of FIG. 9, where $v_Y$ is a parameter.

Moreover, FIG. 13 shows $i_v$-$v_{XY}$ characteristics, where $v_Y$ is a parameter, $v_{P2Y}=-4$ V, $v_{N1Y}=2.5$ V, $v_{N2B}=v_X=0$V, and $v_{N2Y}=v_Y$.

Figure 14:
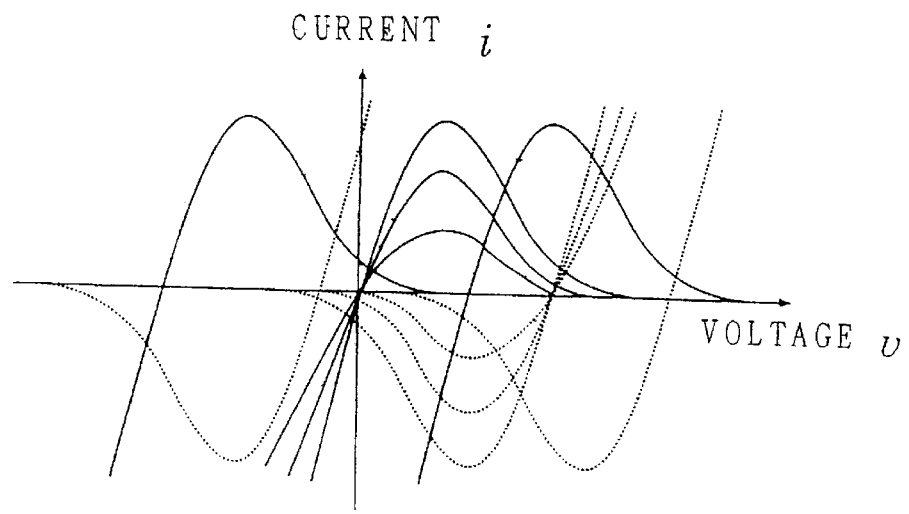
FIG. 14 is a graph in relation to the embodiment of the present invention, showing a variety of nonlinear resistance characteristics.

The numerical simulations have confirmed that the circuits of the present invention show Λ- and V-shaped I-V characteristics. It has also been proved that the I-V characteristics can be controlled by external voltages and that various nonlinear resistor characteristics can be obtained as shown in FIG. 14.

[4] Experiments Performed by Use of Discrete Elements

Prototypes of the circuits of the present invention were fabricated by use of discrete electronic components. As MOSFETs MN and MP in the circuits, FETs in CMOS-IC HD14007UBP were used. In addition, coupling capacitances are assumed as $C_{N1}=C_{N2}=C_{P1}=C_{P2}=0.1 \ \mu F$.

Figure 15:
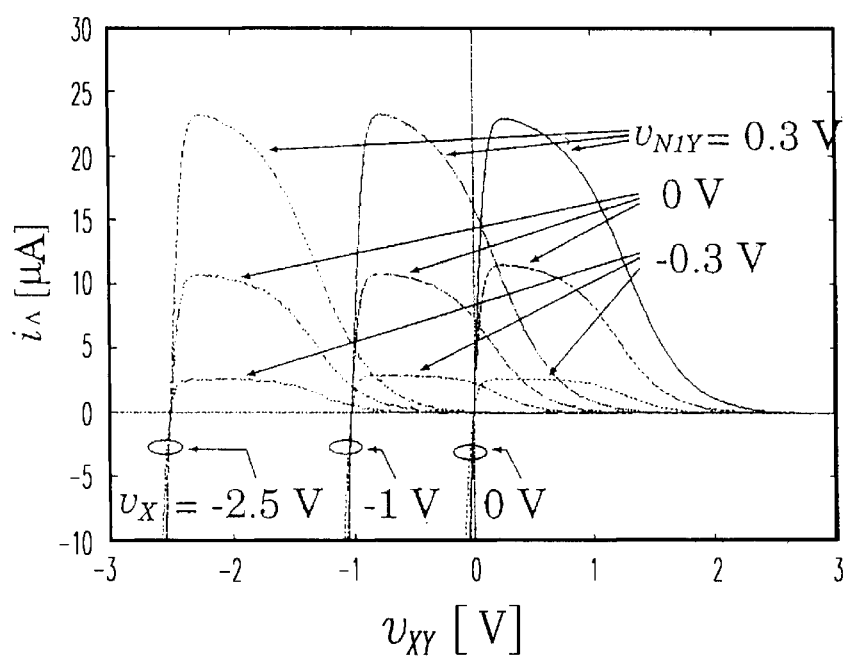
FIG. 15 is a graph showing results of a measurement in which variation in $i_\Lambda$ with $v_{XY}$ in the circuit of FIG. 7 was measured, where $v_{P2Y}$=–4 V, $v_{N2Y}$=3.2 V, $v_{P1A}$=$v_Y$=0 V, and $v_{N1Y}$ and $v_X$ are parameters.

FIG. 15 shows measured results of $i_\Lambda$-$v_{XY}$ characteristics of the circuit of FIG. 7, where $v_{N1Y}$ and $v_X$ are parameters, $v_{P2Y}=-4$ V, $v_{N2Y}=3.2$ V, and $v_{P1A}=v_Y=0$ V. The results correspond to those of numerical simulations shown in FIG. 10.

Figure 16:
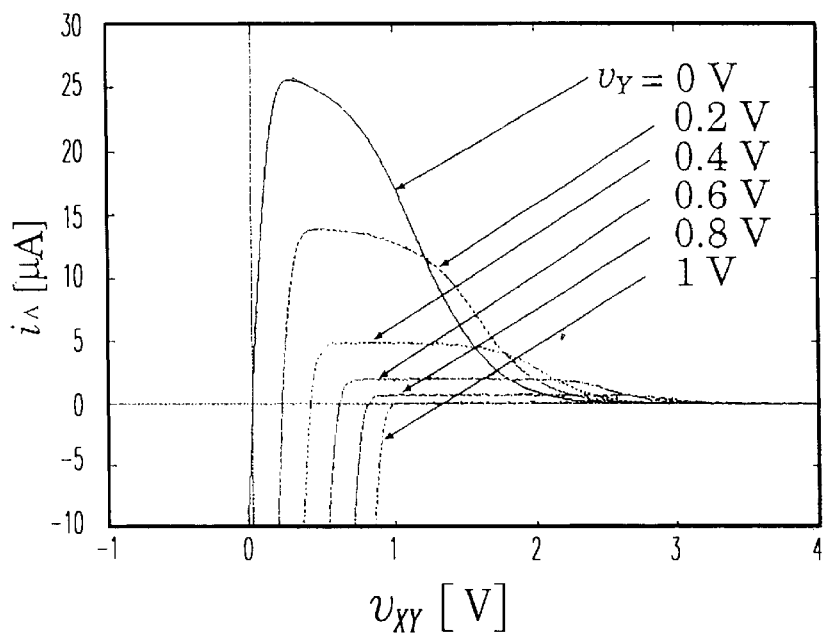
FIG. 16 is a graph showing results of a measurement in which variation in $i_\Lambda$ with $v_{XY}$ in the circuit of FIG. 7 was measured, where $v_{N1Y}$=3.5 V, $v_{P2A}$=–4 V, $v_{P1A}$=$v_X$=0 V, $v_{N2Y}$=$v_Y$, and $v_Y$ is a parameter.

Further, FIG. 16 shows $i_\Lambda$-$v_{XY}$ characteristics of the circuit of FIG. 7, where $v_Y$ is a parameter, $v_{N1Y}=3.5$ V, $v_{P2A}=-4$ V, $v_{P1A}=v_X=0$ V, and $v_{N2Y}=v_Y$. The results correspond to those of numerical simulations shown in FIG. 11.

Figure 17:
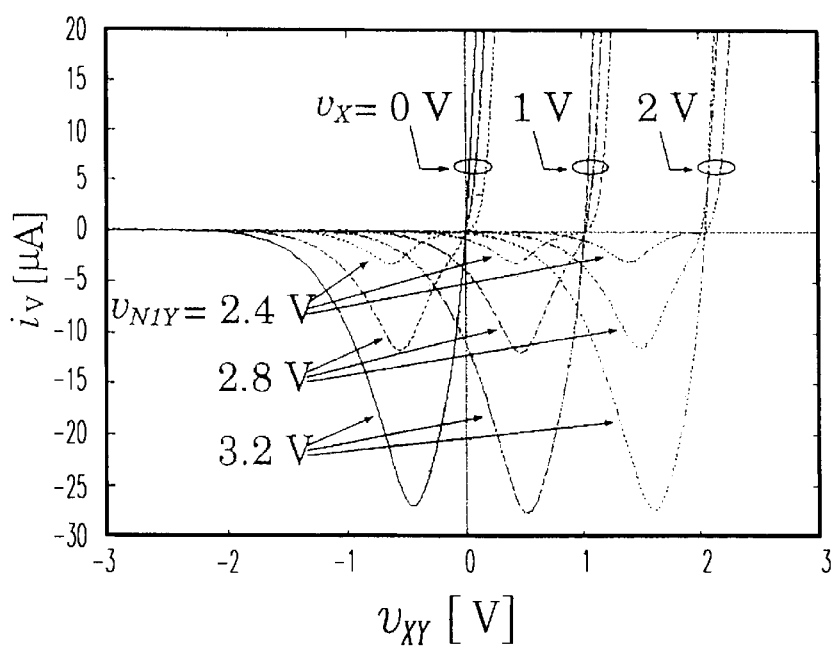
FIG. 17 is a graph showing $v_{XY}$-$i_\Lambda$ characteristics of the circuit of FIG. 9, where $v_{P2Y}$=–4 V, and $v_{N2B}$=$v_{P1Y}$=$v_Y$=0 V, and $v_{N1Y}$ and $v_X$ are parameters.

Then, FIG. 17 shows $i_v$-$v_{XY}$ characteristics of the circuit of FIG. 9, where $v_{N1Y}$ and $v_X$ are parameters, $v_{P2Y}=-4$V, and $v_{N2B}=v_{P1Y}=v_Y=0$ V. The results correspond to those of numerical simulations shown in FIG. 12.

Moreover, FIG. 18 shows $i_v$-$v_{XY}$ characteristics of the circuit of FIG. 9, where $v_Y$ is a parameter, $v_{P2Y}=-4$ V, $v_{N1Y}=3.2$ V, $v_{N2B}=v_X 0$ V, and $v_{N2Y}=v_Y$. The results correspond to those of numerical simulations shown in FIG. 13.

The above experimental results are qualitatively consistent with the results of the numerical simulations described in the previous section. That is, the experiments have also proved that the circuits of the present invention show nonlinear resistor characteristics.

As has been described, a nonlinear resistor circuit which can be integrated by use of a standard CMOS process was obtained. According to the circuit of the present invention, a variety of Λ- or V-shaped I-V characteristics can be provided through control of external voltages.

Therefore, the circuit of the present invention may be applicable to various signal processing circuits, oscillators, impedance simulation circuits, memory circuits, logic circuits, and chaos generating circuits. Moreover, the circuit of the present invention is considered applicable to integration of pulse-type hardware chaos neuron circuits (See Fifth reference), Furthermore, the above application circuits can be made compact through integration by use of a floating-gate technique (see sixth reference and seventh reference).

The present invention is not limited to the above-described embodiments. Numerous modifications and variations of the present invention are possible in light of the spirit of the present invention, and they are not excluded from the scope of the present invention.

As has been described, the present invention provides the following effects.

(1) Λ-type and V-type nonlinear resistance characteristics are both obtained by use of the same circuit configuration.
(2) The nonlinear resistance characteristics can be varied through application of an external control voltage.
(3) Since only enhancement-type MOSFETs are used, the nonlinear resistor circuit can be fabricated in the form of an integrated circuit in a standard CMOS process.
(4) Since nonlinear capacitors can be used for input coupling capacitors, the nonlinear resistor circuit can be fabricated in the form of an integrated circuit in an inexpensive CMOS process in which linear capacitors are not available.
(5) When the size of MOSFETs used in the nonlinear resistor circuit is reduced, the input coupling capacitance can be reduced accordingly. The parasitic capacitance $C_O$ (see section [1-1]) does not affect the essential characteristics of the circuit. Accordingly, the circuit can be made compact with ease.
(6) Use of vMOSFETs enables the circuit to be rendered very compact, thereby enabling efficient integration of the circuit.

Industrial Applicability

The nonlinear resistor circuit using capacitively-coupled multi-input mosfets according to the present invention is applicable to various types of signal processing circuits, oscillators, inductance simulation circuits, memory circuits, logic circuits, and chaos generators.

What is claimed is:

1. A nonlinear resistor circuit using capacitively coupled multi-input MOSFETs, comprising a core circuit which has a nonlinear resistance characteristic and which comprises:
    (a) an enhancement-type N-channel MOSFET having a capacitively-coupled multi-input gate terminal,
    (b) an enhancement-type P-channel MOSFET having a capacitively-coupled multi-input gate terminal, and
    (c) the source terminals of the MOSFETs being connected with each other,
    wherein, a fifth potential is provided between the drain terminal of the N-channel MOSFET and a first input/output terminal; a sixth potential is provided between the drain terminal of the P-channel MOSFET and a second input/output terminal; a first potential is provided between the drain terminal of the N-channel MOSFET and a first capacitor connected to the gate of the P-channel MOSFET or between the first input/output terminal and the first capacitor; a second potential is provided between the drain terminal of the P-channel MOSFET and a second capacitor connected to the gate of the P-channel MOSFET or between the second input/output terminal and the second capacitor; a third potential is provided between the drain terminal of the P-channel MOSFET and a third capacitor connected to the gate of the N-channel MOSFET or between the second input/output terminal and the third capacitor; and a fourth potential is provided between the drain terminal of the P-channel MOSFET and a fourth capacitor connected to the gate of the N-channel MOSFET or between the second input/output terminal and the fourth capacitor, so that a Λ-type current voltage characteristic, which is varied through application of an external control voltage, is obtained.

2. A nonlinear resistor circuit using capacitively-coupled multi-input MOSFETs, comprising a core circuit which has a nonlinear resistance characteristic and which comprises:
    (a) an enhancement-type P-channel MOSFET having a capacitively-coupled multi-input gate terminal,
    (b) an enhancement-type N-channel MOSFET having a capacitively-coupled multi-input gate terminal, and
    (c) the source terminals of the MOSFETs being connected with each other,
    wherein, a fifth potential is provided between the drain terminal of the P-channel MOSFET and a first input/output terminal; a sixth potential is provided between the drain terminal of the N-channel MOSFET and a second input/output terminal; a first potential is provided between the drain terminal of the P-channel MOSFET and a first capacitor connected to the gate of the N-channel MOSFET or between the first input/output terminal and the first capacitor; a second potential is provided between the drain terminal of the N-channel MOSFET and a second capacitor connected to the gate of the N-channel MOSFET or between the second input/output terminal and the second capacitor; a third potential is provided between the drain terminal of the N-channel MOSFET and a third capacitor connected to the gate of the P-channel MOSFET or between the second input/output terminal and the third capacitor; and a fourth potential is provided between the drain terminal of the N-channel MOSFET and a fourth capacitor connected to the gate of the P-channel MOSFET or between the second input/output terminal and the fourth capacitor so that a V-type current voltage characteristic, which is varied through application of an external control voltage, is obtained.

* * * * *

UNITED STATES PATENT AND TRADEMARK OFFICE
CERTIFICATE OF CORRECTION

PATENT NO.    : 6,356,136 B1
DATED         : March 12, 2001
INVENTOR(S)   : Horio et al.

It is certified that error appears in the above-identified patent and that said Letters Patent is hereby corrected as shown below:

Title page,
Item [57], ABSTRACT,
Line 4, "A-type" should read -- ∧-type --

Column 1,
Line 56, "type," should read -- type. --

Column 3,
Line 35, "$CN_2$" should read -- $C_{N2}$ --

Column 13,
Line 30, "$v_{MY}^{—}$" should read -- $v_{MY}=$ --
Line 65, "$C_{P1}C_{P2}$" should read -- $C_{P1}=C_{P2}$ --

Signed and Sealed this

Twenty-ninth Day of October, 2002

Attest:

JAMES E. ROGAN
Attesting Officer     *Director of the United States Patent and Trademark Office*